(12) United States Patent
Huggins

(10) Patent No.: US 6,927,073 B2
(45) Date of Patent: Aug. 9, 2005

(54) METHODS OF FABRICATING MAGNETORESISTIVE MEMORY DEVICES

(75) Inventor: Harold A. Huggins, Alexandria, VA (US)

(73) Assignee: Nova Research, Inc., Alexandria, VA (US)

( * ) Notice: Subject to any disclaimer, the term of this patent is extended or adjusted under 35 U.S.C. 154(b) by 45 days.

(21) Appl. No.: 10/435,669

(22) Filed: May 12, 2003

(65) Prior Publication Data

US 2004/0001368 A1 Jan. 1, 2004

Related U.S. Application Data

(60) Provisional application No. 60/378,051, filed on May 16, 2002.

(51) Int. Cl.[7] .............................................. H01L 21/00
(52) U.S. Cl. ............................ 438/3; 438/238; 438/381
(58) Field of Search .............................. 438/3, 48, 238, 438/257, 381, 311, 680, 692, 706, 712, 740, 745

(56) References Cited

U.S. PATENT DOCUMENTS

| | | |
|---|---|---|
| 3,095,555 A | 6/1963 | Moore |
| 3,357,871 A | 12/1967 | Jones, Jr. |
| 3,428,499 A | 2/1969 | Cullis |
| 3,448,510 A | 6/1969 | Bippus et al. |
| 3,477,885 A | 11/1969 | Henker |
| 3,587,166 A | 6/1971 | Alexander |
| 3,654,000 A | 4/1972 | Totah et al. |
| 3,661,741 A | 5/1972 | Meek |
| 3,783,499 A | 1/1974 | Hughes, Jr. et al. |
| 3,924,323 A | 12/1975 | Trevail et al. |
| 4,292,730 A | 10/1981 | Ports |
| 4,402,770 A | 9/1983 | Koon |
| 4,409,043 A | 10/1983 | Koon |

(Continued)

FOREIGN PATENT DOCUMENTS

JP 10-116489 5/1998
WO WO 00-58970 A2 10/2000

OTHER PUBLICATIONS

US 6,391,219, 5/2002, Kang et al. (withdrawn)

Ahn, "Nondestructive Readout, High–Density Memory," IBM Technical Disclosure Bulletin, Mar. 1969, pp. 1266–1267, vol. 11, No. 10.

Franklin and Styles, "Batch Fabrication Method for a Multiple Magnetic Head Closure Piece," IBM Technical Disclosure Bulletin, Nov. 1975, p. 1981, vol. 18, No. 6.

Excerpts from the SiGen Corporation website pages available at http://www.sigen.com, May 21, 2002.

(Continued)

*Primary Examiner*—David Nhu
(74) *Attorney, Agent, or Firm*—Cooley Godward LLP

(57) ABSTRACT

In accordance with one or more embodiments of the present invention, a technique fabricating a magnetoresistive memory device, where the magnetoresistive memory device has a magnetic memory element and a plurality of conductors for at least one of reading and writing the magnetic memory element. The plurality of conductors include a first conductor at least partially located at a first side of the magnetic memory element for reading the magnetic memory element, a second conductor at least partially located at a second side of the magnetic memory element for reading the magnetic memory element, a third conductor at least partially located at the second side of the magnetic memory element for writing the magnetic memory element, and a fourth conductor at least partially located at the first side of the magnetic memory element for writing the magnetic memory element. The first conductor is formed before the fourth conductor.

37 Claims, 23 Drawing Sheets

U.S. PATENT DOCUMENTS

| | | |
|---|---|---|
| 4,883,773 A | 11/1989 | Ishikura |
| 4,983,251 A | 1/1991 | Haisma et al. |
| 5,024,964 A | 6/1991 | Rohrer et al. |
| 5,028,558 A | 7/1991 | Haisma et al. |
| 5,034,343 A | 7/1991 | Rouse et al. |
| 5,064,499 A | 11/1991 | Fryer |
| 5,070,026 A | 12/1991 | Greenwald et al. |
| 5,173,873 A | 12/1992 | Wu et al. |
| 5,389,566 A | 2/1995 | Lage |
| 5,399,231 A | 3/1995 | McCarthy |
| 5,424,236 A | 6/1995 | Daughton et al. |
| 5,475,304 A | 12/1995 | Prinz |
| 5,477,482 A | 12/1995 | Prinz |
| 5,496,759 A | 3/1996 | Yue et al. |
| 5,541,868 A | 7/1996 | Prinz |
| 5,569,544 A | 10/1996 | Daughton |
| 5,569,617 A | 10/1996 | Yeh et al. |
| 5,587,943 A | 12/1996 | Torok et al. |
| 5,640,343 A | 6/1997 | Gallagher et al. |
| 5,650,958 A | 7/1997 | Gallagher et al. |
| 5,661,062 A | 8/1997 | Prinz |
| 5,732,016 A | 3/1998 | Chen et al. |
| 5,804,458 A | 9/1998 | Tehrani et al. |
| 5,828,598 A | 10/1998 | Chen et al. |
| 5,838,608 A | 11/1998 | Zhu et al. |
| 5,902,690 A | 5/1999 | Tracy et al. |
| 5,936,882 A | 8/1999 | Dunn |
| 5,940,319 A | 8/1999 | Durlam et al. |
| 5,949,707 A | 9/1999 | Pohm et al. |
| 5,956,267 A | 9/1999 | Hurst et al. |
| 5,966,322 A | 10/1999 | Pohm et al. |
| 5,969,978 A | 10/1999 | Prinz |
| 5,985,687 A | 11/1999 | Bowers et al. |
| 5,985,742 A | 11/1999 | Henley et al. |
| 5,991,193 A | 11/1999 | Gallagher et al. |
| 5,994,207 A | 11/1999 | Henley et al. |
| 6,010,579 A | 1/2000 | Henley et al. |
| 6,013,567 A | 1/2000 | Henley et al. |
| 6,016,269 A * | 1/2000 | Peterson et al. ............ 365/171 |
| 6,033,974 A | 3/2000 | Henley et al. |
| 6,048,411 A | 4/2000 | Henley et al. |
| 6,048,739 A | 4/2000 | Hurst et al. |
| 6,083,324 A | 7/2000 | Henley et al. |
| 6,103,599 A | 8/2000 | Henley et al. |
| 6,111,784 A | 8/2000 | Nishimura |
| 6,127,244 A | 10/2000 | Lee |
| 6,146,979 A | 11/2000 | Henley et al. |
| 6,153,443 A | 11/2000 | Durlam et al. |
| 6,159,824 A | 12/2000 | Henley et al. |
| 6,159,825 A | 12/2000 | Henley et al. |
| 6,165,803 A | 12/2000 | Chen et al. |
| 6,172,902 B1 * | 1/2001 | Wegrowe et al. ........... 365/158 |
| 6,174,737 B1 | 1/2001 | Durlam et al. |
| 6,177,359 B1 | 1/2001 | Chen et al. |
| 6,180,497 B1 | 1/2001 | Sato et al. |
| 6,211,090 B1 | 4/2001 | Duriam et al. |
| 6,221,740 B1 | 4/2001 | Bryan et al. |
| 6,221,774 B1 | 4/2001 | Malik |
| 6,242,298 B1 | 6/2001 | Kawakubo |
| 6,245,161 B1 | 6/2001 | Henley et al. |
| 6,252,390 B1 | 6/2001 | Black, Jr. et al. |
| 6,263,941 B1 | 7/2001 | Bryan et al. |
| 6,284,631 B1 | 9/2001 | Henley et al. |
| 6,285,581 B1 | 9/2001 | Tehrani et al. |
| 6,290,804 B1 | 9/2001 | Henley et al. |
| 6,291,313 B1 | 9/2001 | Henley et al. |
| 6,291,314 B1 | 9/2001 | Henley et al. |
| 6,291,326 B1 | 9/2001 | Henley et al. |
| 6,303,218 B1 | 10/2001 | Kamiguchi et al. |
| 6,303,405 B1 | 10/2001 | Yoshida et al. |
| 6,333,202 B1 | 12/2001 | Adkisson et al. |
| 6,333,215 B1 | 12/2001 | Matsuda et al. |
| 6,335,264 B1 | 1/2002 | Henley et al. |
| 6,346,458 B1 | 2/2002 | Bower |
| 6,358,756 B1 | 3/2002 | Sandhu et al. |
| 6,358,757 B2 | 3/2002 | Anthony |
| 6,365,513 B1 | 4/2002 | Furukawa et al. |
| 6,368,878 B1 | 4/2002 | Abraham et al. |
| 6,376,260 B1 | 4/2002 | Chen et al. |
| 6,376,333 B1 | 4/2002 | Yamazaki et al. |
| 6,380,108 B1 | 4/2002 | Linthicum et al. |
| 6,381,170 B1 | 4/2002 | Prinz |
| 6,391,483 B1 | 5/2002 | Zhu et al. |
| 6,391,658 B1 | 5/2002 | Gates et al. |
| 6,391,740 B1 | 5/2002 | Cheung et al. |
| 6,391,743 B1 | 5/2002 | Iwane et al. |
| 6,396,734 B2 | 5/2002 | Ishikawa et al. |
| 6,396,735 B2 | 5/2002 | Michijima et al. |
| 6,735,111 B2 * | 5/2004 | Nejad .......................... 365/158 |
| 6,791,870 B2 * | 9/2004 | Nejad .......................... 365/158 |
| 2002/0048844 A1 | 4/2002 | Sakaguchi |

OTHER PUBLICATIONS

Zhu, Zheng and Prinz, "Ultrahigh density vertical magnetoresistive random access memory (invited)," Symposium on Magnetic Technology for a Single Chip Computer, Journal of Applied Physics, May 1, 2000, pp. 6668–6673, vol. 87, No. 9.

Bussmann, Prinz, Cheng and Wang, "Switching of vertical giant magnetoresistance devices by current through the device," Applied Physics Letters, Oct. 18, 1999, pp. 2476–2478, vol. 75, No. 16.

Bussmann, Prinz, Bass and Zhu, "Current–driven reversal in annular vertical giant magnetoresistive devices," Applied Physics Letters, Apr. 2, 2001, pp. 2029–2030, vol. 78, No. 14.

Johnson, "Magnetoelectronic memories last and last . . . ," IEEE Spectrum, Feb. 2000, pp. 33–40.

Daughton, "Magnetoresistive memory technology," Thin Solid Films, 1992, pp. 162–168.

EBN Staff, "Motorola moves MRAM memory technology closer to market," Embedded Edge, May 10, 2000, pp. 1–2, available at http://www.ebnews.com.

Gallagher, et al., "Microstructured magnetic tunnel junctions (invited)," Symposium on Magnetoelectric Devices for Information Storage, Journal of Applied Physics, Apr. 15, 1997, pp. 3741–3746, vol. 81, No. 8.

Chen, et al., "High density submicron magnetoresistive random access memory (invited)," Magnetoresistive Magnetic Random Access Memory, Journal of Applied Physics, Apr. 15, 1999, pp. 5822–5827, vol. 85, No. 8.

Daughton, "Advanced MRAM Concepts," Feb. 7, 2001, pp. 1–6.

Daughton, "Magnetoresistive Random Access Memory (MRAM)," Feb. 4, 2000, pp. 1–13.

Cheung, "The Paste–and–Cut Approach for Electronic Materials Integration," presentation given on or about Oct. 5, 2001, Department of Electrical Engineering and Computer Science, University of California—Berkeley.

Van Zant, "Microchip Fabrication—A Practical Guide to Semiconductor Processing," Fourth Edition, Table of Contents, pp. vii–xiv, McGraw–Hill, New York.

Quirk and Serda, "Semiconductor Manufacturing Technology," 2001, Table of Contents, pp/ iii–x, Prentice Hall, New Jersey.

S. Tehrani et al., "High Density Submicron Magnetoresistive Random Access Memory (Invited)," Journal of Applied Physics, Apr. 15, 1999, vol. 85, No. 8, pp. 5822–5827.

* cited by examiner

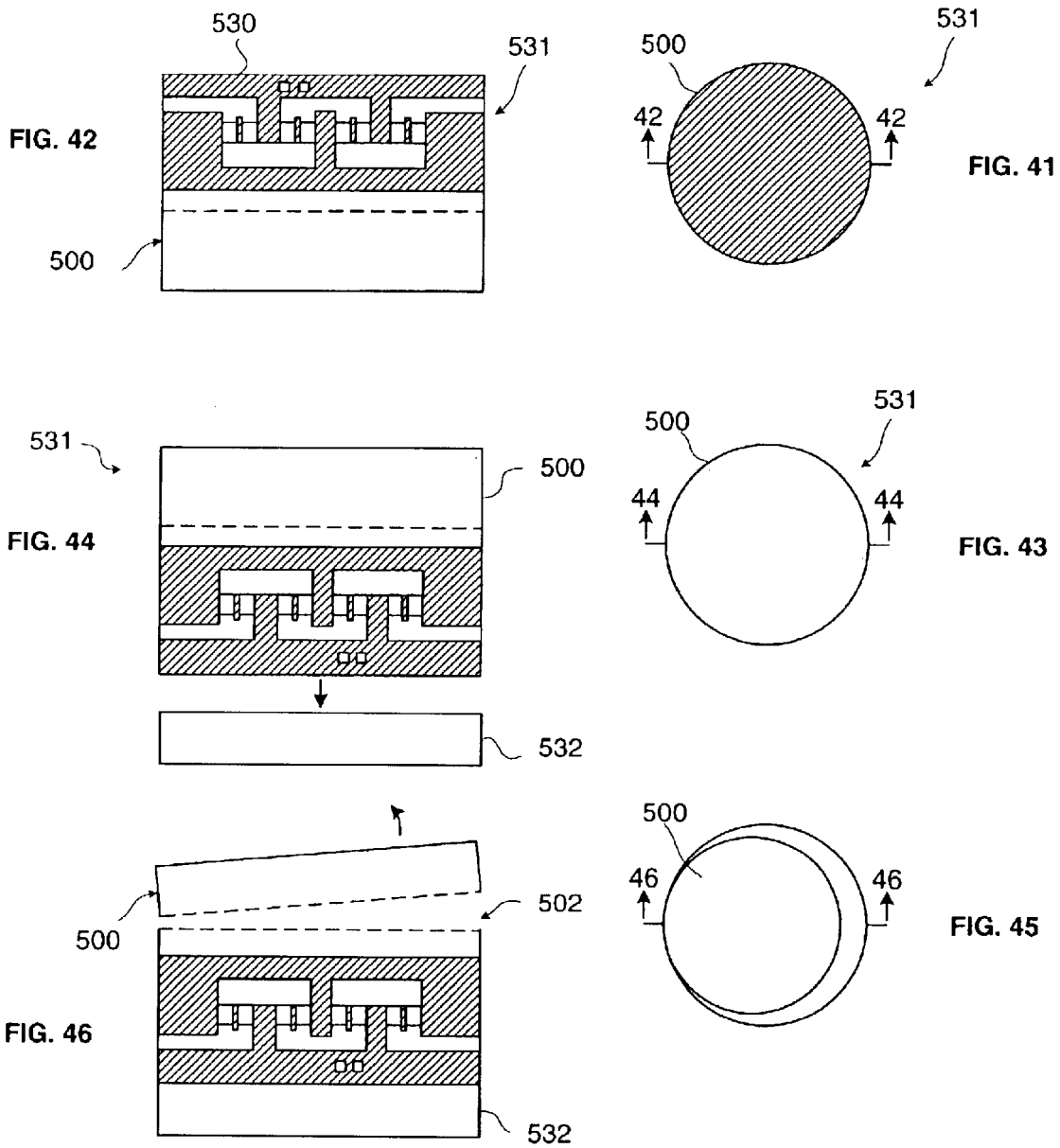

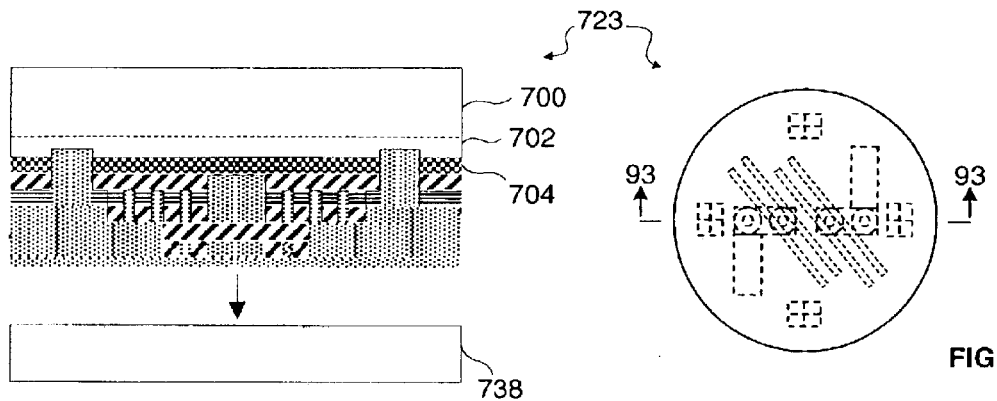
FIG. 93
FIG. 92
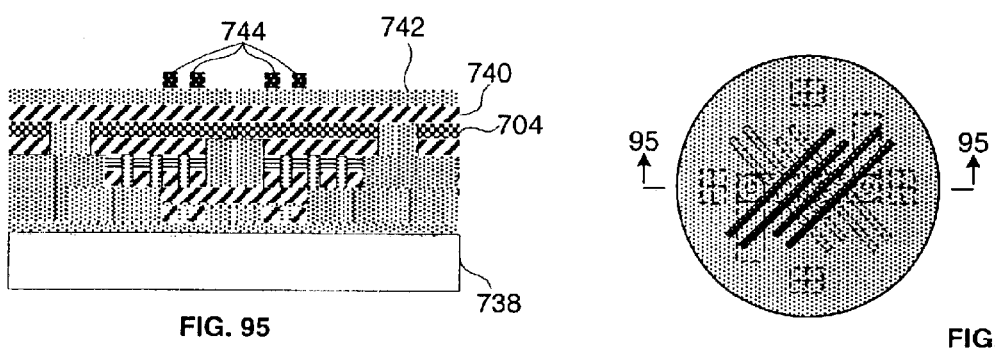
FIG. 95
FIG. 94
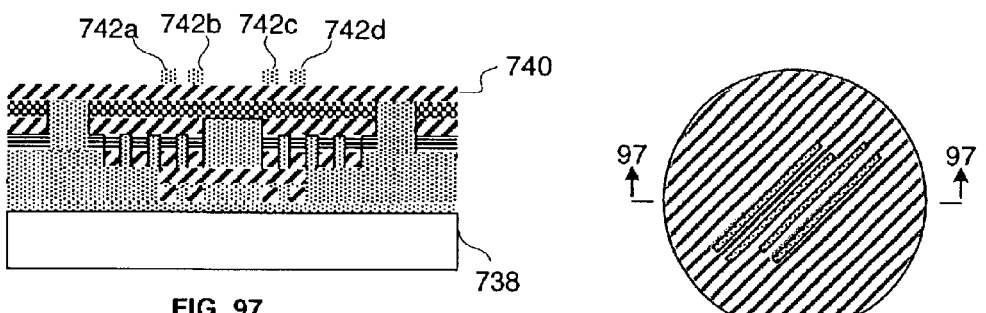
FIG. 97
FIG. 96
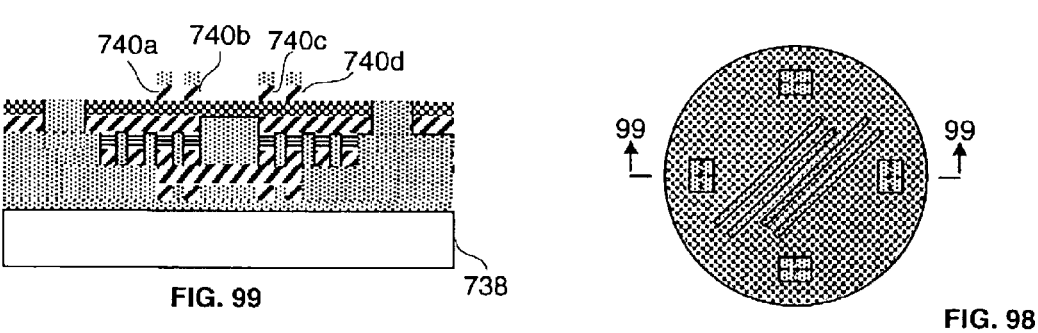
FIG. 99
FIG. 98

METHODS OF FABRICATING MAGNETORESISTIVE MEMORY DEVICES

This application claims benefit under 35 U.S.C. §119(e) of U.S. Provisional Patent Application No. 60/378,051 filed on May 16, 2002, the disclosure of which is incorporated by reference herein in its entirety.

The U.S. Government has a paid-up license in this invention and the right in limited circumstances to require the patent owner to license others on reasonable terms as provided for by the terms of NRL Contract No. N00173-02-C-2010 awarded by the U.S. Naval Research Laboratory.

FIELD OF THE INVENTION

The present invention relates to methods of fabricating magnetoresistive memory devices.

DESCRIPTION OF THE RELATED ART

Magnetoresistive memory devices store data bits by using magnetic charges instead of electrical charges commonly used by dynamic random access memory and other volatile and non-volatile memory devices. Magnetoresistive memory devices offer the advantages of nonvolatility and are read by simply measuring resistance differences due to classical anisotropic magnetoresistance phenomena. If magnetoresistive memory devices can be successfully manufactured, they have the potential to replace volatile and nonvolatile semiconductor memory devices, such as flash, DRAM, and SRAM.

Conventional magnetoresistive memory devices have been designed in a variety of known configurations, such as those disclosed in U.S. Pat. No. 6,391,483, for example. As is illustrated sequentially by FIGS. 1–9, such a magnetoresistive memory device 50 is essentially fabricated by forming on a substrate 51, in the following order, a word line 52, a bit line 53, a magnetic memory element 54, an additional bit line 55, and an additional word line 56. In the fabrication of the first word line 52, an insulating layer 57 is deposited, patterned, and then etched to form the channels 58 illustrated in FIG. 1. Conductive metal 59 is then deposited over the channels 58 and the excess then removed by chemical mechanical polishing ("CMP") until metal remains only in the channels to define the word line 52 in FIG. 3. As is illustrated in remaining FIGS. 4–9, additional insulative layers, conductive layers, and magnetic layers are then deposited, patterned, and/or etched over the formed word line 52 to define the bit line 53, the magnetic memory element 54, the additional bit line 55, and the additional word line 56.

Because minor fluctuations in the topography of the magnetic material of the magnetic memory element 54 detrimentally affect the performance of the magnetoresistive memory device 50, it is important that the surface of the polished metal of the first formed word line 52 and adjacent insulative material be smooth and flat. In all but the most fortuitous of situations, however, these requirements exceed conventional CMP capabilities. For example, in many instances, dishing effects associated with the formation of the first word line 52 tend to propagate through the magnetoresistive memory element 54 and compromise performance of the magnetoresistive memory device 50. Examples of dishing effects can be seen in U.S. Pat. Nos. 5,477,482 and 5,661,062 which are directed to high density ferromagnetic memory devices. Efforts to eliminate these problems have been unsuccessful.

SUMMARY OF EMBODIMENTS OF THE PRESENT INVENTION

In light of the foregoing problems associated with conventional methods of fabricating magnetoresistive memory devices, generally speaking, an object of one or more embodiments of the present invention is to provide one or more methods of fabricating magnetoresistive memory devices having a high degree of uniformity. Specifically, the uniformity of material upon which a magnetic memory element is formed, as well as the uniformity of other layers of magnetoresistive memory device, is relatively precise as compared to some conventional manufacturing techniques.

In accordance with one or more embodiments of the present invention, one method concerns fabricating a magnetoresistive memory device, where the magnetoresistive memory device has a magnetic memory element and a plurality of conductors for at least one of reading and writing the magnetic memory element. The plurality of conductors include a first conductor at least partially located at a first side of the magnetic memory element for reading the magnetic memory element, a second conductor at least partially located at a second side of the magnetic memory element for reading the magnetic memory element, a third conductor at least partially located at the second side of the magnetic memory element for writing the magnetic memory element, and a fourth conductor at least partially located at the first side of the magnetic memory element for writing the magnetic memory element. In this method the first conductor is formed before the fourth conductor.

In accordance with one or more embodiments of the present invention, one method of manufacturing a magnetoresistive memory device includes the following steps in the following order: forming at least a first conductor for at least reading a magnetic memory element of the magnetoresistive memory device, the magnetic memory element for storing a bit state of the magnetoresistive memory device; forming the magnetic memory element; forming at least a second conductor for at least reading the magnetic memory element; forming at least a third conductor for at least writing the magnetic memory element at one side of the magnetic memory element; and forming at least a fourth conductor for at least writing the magnetic memory element at another side of the magnetic memory element that is opposite from the one side.

In accordance with one or more embodiments of the present invention, one method includes forming a subassembly of a magnetoresistive memory device, where the formed subassembly includes a magnetic memory element of the magnetoresistive memory device. The subassembly is then inverted, and at least a portion of the magnetoresistive memory device is formed on the inverted subassembly, where the portion includes at least one conductor for at least one of reading and writing the memory device.

In accordance with one or more embodiments of the present invention, one method of manufacturing a magnetoresistive memory device includes forming a first read line for at least reading a bit state of a magnetic memory element of the magnetoresistive memory device. After the first read line has been formed, the magnetic memory element of the magnetoresistive device is formed. After the magnetic memory element is formed, a second read line for at least reading the bit state of the magnetic memory element is formed, where the first read line is located at a first side of the magnetic memory element and the second read line is located at a second side of the magnetic memory element that is opposite from the first side. After the second read line is formed, at least one word line for at least writing the magnetic memory element is formed at the first side of the magnetic memory element.

In accordance with one or more embodiments of the present invention, one method of manufacturing a magnetoresistive memory device includes forming a subassembly of the magnetoresistive memory device on a first substrate, where the subassembly includes a magnetic memory element of the magnetoresistive memory device. The formed subassembly is then attached to a second substrate. A remaining portion of the magnetoresistive memory device is then formed, where the remaining portion includes at least one conductor for at least one of reading and writing the magnetic memory element.

In accordance with one or more embodiments of the present invention, one method includes utilizing a donor substrate process during the forming of a magnetic memory element and a plurality of conductors of a magnetoresistive memory device, the plurality of conductors for reading and writing the magnetic memory element.

In accordance with one or more embodiments of the present invention, a magnetoresistive memory device on a substrate includes a magnetic memory element and a first conductor at least partially located at a first side of said magnetic memory element for at least reading a bit state of said magnetic memory element, where the first side of the magnetic memory element faces in a direction toward the substrate. The magnetoresistive memory element further includes a second conductor at least partially located at a second side of the magnetic memory element for at least reading the bit state of said magnetic memory element. The magnetic memory element also includes a third conductor at least partially located at the first side of the magnetic memory element for at least writing the magnetic memory element, where the third conductor has a face that faces in a direction toward the magnetic memory element, said face not including indications of a polishing process.

Other objects, advantages, and features associated with embodiments of the present invention will become more readily apparent to those skilled in the art from the following detailed description. As will be realized, the invention is capable of other and different embodiments, and its several details are capable of modification in various obvious aspects, all without departing from the invention. Accordingly, the drawings and the description are to be regarded as illustrative in nature, and not limitative.

BRIEF DESCRIPTION OF THE DRAWINGS

FIG. 41 is a top view of the substrate illustrated in FIG. 39 after depositing an insulator thereon.

FIG. 42 is a cross-sectional view of the substrate illustrated in FIG. 41 taken along the line 42—42 in FIG. 41.

FIG. 43 is a top view of the substrate illustrated in FIG. 41 after inverting the subassembly.

FIG. 44 is a cross-sectional view of the substrate illustrated in FIG. 43 taken along the line 44—44 in FIG. 43 and illustrating the attachment of the inverted subassembly to a second substrate.

FIG. 45 is a top view of the inverted subassembly illustrated in FIG. 43 illustrating the removal of a donor substrate.

FIG. 46 is a cross-sectional view of the inverted subassembly illustrated in FIG. 45 taken along the line 46—46 in FIG. 45 and illustrating the removal of the donor substrate.

FIG. 92 is a top view of the substrate illustrated in FIG. 90 after inverting the subassembly.

FIG. 93 is a cross-sectional view of the substrate illustrated in FIG. 92 taken along the line 93—93 in FIG. 92 and illustrating the attachment of the subassembly to a second substrate.

FIG. 94 is a top view of the inverted subassembly illustrated in FIG. 92 after a first substrate has been removed and a top bit line conductive layer, an etch mask layer, and resist material have been deposited thereon, and the resist material has been patterned.

FIG. 95 is a cross-sectional view of the inverted subassembly illustrated in FIG. 94 taken along the line 95—95 in FIG. 94.

FIG. 96 is a top view of the inverted subassembly illustrated in FIG. 94 after the etch mask layer has been etched and portions of the etch mask layer have been removed.

FIG. 97 is a cross-sectional view of the inverted subassembly illustrated in FIG. 96 taken along the line 97—97 in FIG. 96.

FIG. 98 is a top view of the inverted subassembly illustrated in FIG. 96 after the top bit line conductive layer has been etched and portions of the top bit line conductive layer have been removed.

FIG. 99 is a cross-sectional view of the inverted subassembly illustrated in FIG. 98 taken along the line 99—99 in FIG. 98.

DETAILED DESCRIPTION OF EMBODIMENTS OF THE INVENTION

The embodiments of the invention described herein concern methods of fabricating magnetoresistive memory devices. As will be appreciated, the methods described herein may be used to fabricate a variety of differently configured magnetoresistive memory devices. Set forth below are descriptions of many embodiments of magnetoresistive memory devices (some of which are not illustrated) that may be fabricated in accordance with one or more methods of the present invention. Magnetoresistive devices formed according to embodiments of the present invention may include, for example, giant magnetoresistive (GMR) devices, magnetic tunneling junction (MTJ) devices, or other magnetic memory devices. Exemplary magnetoresistive memory devices that may be fabricated in accordance with one or more methods of the present invention include, but are not limited to the devices described in U.S. Pat. Nos.: 3,095,555; 5,070,026; 5,173,873; 5,389,566; 5,424,236; 5,477,482; 5,541,868; 5,587,943; 5,640,343; 5,661,062; 5,732,016; 5,804,458; 5,828,598; 5,838,608; 5,936,882; 5,940,391; 5,949,707; 5,969,978; 6,048,739; 6,111,784; 6,153,443; 6,165,803; 6,174,737; 6,211,090; 6,303,218; 6,358,756; 6,358,757; 6,368,878; 6,376,260; 6,381,170; 6,391,483; 6,391,658; 6,396,735, the disclosures of each being hereby incorporated by reference in its entirety. Some of the techniques for fabricating and/or processing magnetoresistive memory devices described below and used in connection with embodiments of the invention are standard semiconductor fabrication and/or processing techniques, such as those described in the book *Microchip Fabrication: A Practical Guide to Semiconductor Processing* by Peter Van Zant, (4$^{th}$ ed., McGraw-Hill 2000), which is incorporated by reference herein in its entirety. The magnetoresistive memory devices described below may be formed as a group of devices on a substrate, then separated into die, which are then packaged in chips having active and/or passive devices.

Figure 1:
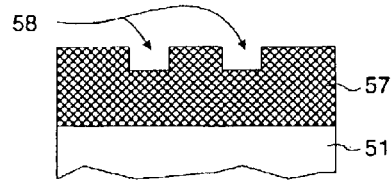
FIGS. 1–9 are cross sectional views of a prior art magnetoresistive memory device being fabricated in accordance with a prior fabrication process.
Figure 2:
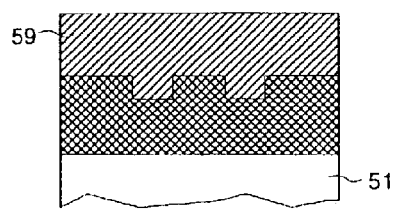
Figure 3:
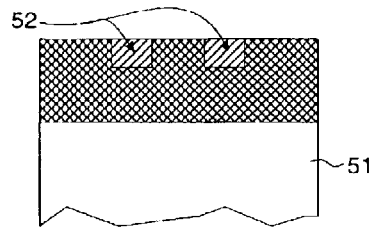
Figure 4:
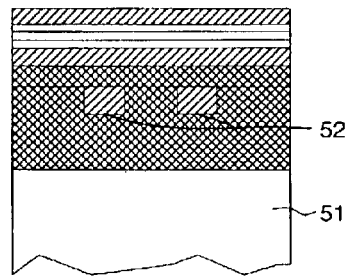
Figure 5:
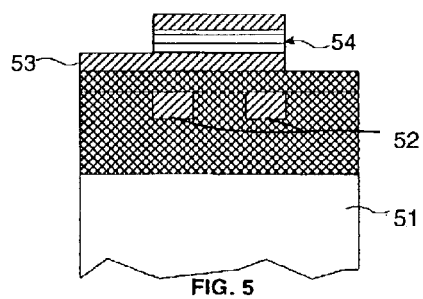
Figure 6:
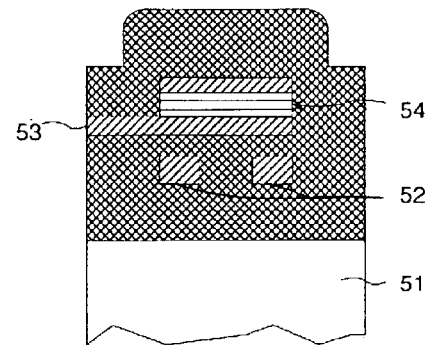
Figure 7:
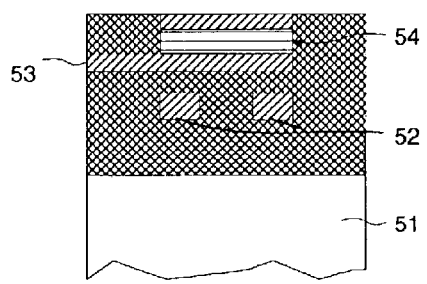
Figure 8:
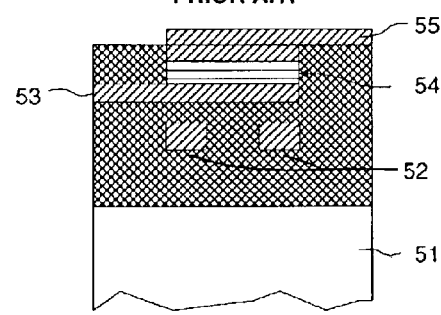
Figure 9:
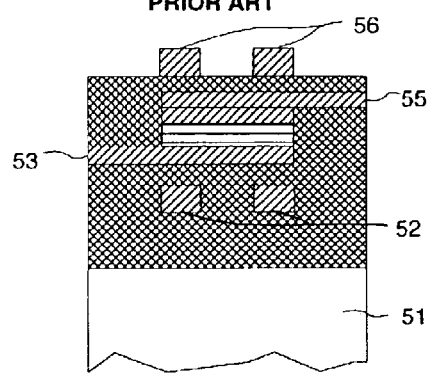
Figure 10:
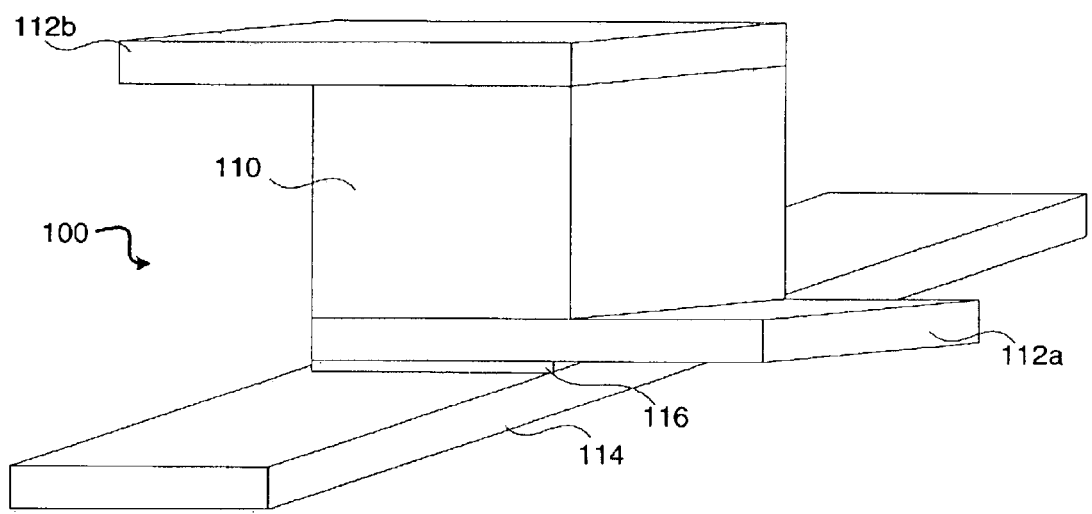
FIG. 10 is a perspective representation of one embodiment of a magnetoresistive memory device fabricated in accordance with one or more methods of the present invention.

FIG. 10 illustrates a representation of a magnetoresistive memory device 100 that may be manufactured in accordance with one embodiment of the present invention. A magnetoresistive memory device 100 is a device that stores data bits by using magnetic charges instead of electrical charges commonly used by dynamic random access memory and other volatile and nonvolatile devices. The magnetoresistive memory device 100 may be used as a data storage device, such as a magnetoresistive random access memory (MRAM), or may be used as a logic device, such as a transistor or other solid state device.

The magnetoresistive memory device 100 is nonvolatile and is read by measuring resistance differences due to classical anisotropic magnetoresistance phenomena. The magnetoresistive memory device 100 includes a memory element 110 having magnetic material, typically in the form of one or more ferromagnetic layers each having a magnetic field or moment, at least one of which whose orientation may be manipulated by one or more conductors. Conductors that function to at least manipulate the orientation of one or more magnetic fields of the memory element 110 so as to "write" the memory element are referred to as word lines. In the illustrated embodiment, the magnetoresistive memory device 100 has a conductor referred to as a word line 114 or a bit line that is dedicated to writing the memory element 110. Specifically, in the memory device 100 shown, the word line 114 only functions to manipulate the orientation of one or more magnetic fields of the memory element so as to write the memory element. Hence, the conductor 114 is insulated from an adjacent conductor 112a by an insulative layer 116, such as SiO$_2$, SiN, an oxide of a layer of the memory element 110, or any other suitable insulative material. The insulative layer 116 may be part of the memory element 110 or separately deposited. In alternative embodiments, the magnetoresistive memory device 100 has a number of different conductors at different locations that each function, either alone or in combination with other conductors, to at least manipulate the orientation of one or more magnetic fields of the memory element 110 so as to write the memory element of the magnetoresistive memory device. In further embodiments, the magnetoresistive memory device 100 has one or more word lines that also function to read the memory element 110.

Referring again to FIG. 10, current passing through the word line 114 will generate a magnetic field that causes one or more magnetic fields of the memory element 110 to change orientation. As is known, the resistance of the memory element 110 will be higher or lower depending upon the orientation of one or more magnetic fields of the memory element 110. For example, if the magnetic field of the magnetic material of the magnetic memory element 110 is parallel with the direction of a read current through the memory element, then the resistance is lower as compared to the resistance when the magnetic field is opposed to the direction of the read current.

As a further example, if the memory element 110 includes a number of magnetic layers, the resistance of the memory element is greatest when the orientation of the magnetic field of different layers are opposite one another (anti-aligned or anti-parallel) and the resistance is lowest when the orientation of the magnetic fields of each layer are identically oriented. As is apparent, the orientation of one or more magnetic fields of the memory element 110 may be circular, radial, vertical, horizontal, or other orientation or combination of orientations so long as a change or manipulation of such an orientation or combination of orientations is detectable anisotropic magnetoresistance. Hence, the location, configuration, and number of word lines may also vary, depending upon the orientation of the magnetic fields to be manipulated.

The orientation of one or more magnetic fields of the memory element 110 is detectable by measuring the resistance through the memory element with current carrying conductors. Conductors that function to at least measure the resistance of the memory element 110 so as to read a state of the memory element 110 are referred to as read lines. In the illustrated embodiment, the conductors 112a, 112b are read lines (also referred to as sense lines) that function to at least measure the resistance of the memory element 110 so as to read the bit state of the memory element 110. In the illustrated embodiment of the magnetoresistive memory device 100, the orientation of one or more magnetic fields of the memory element 110 is such that the current conveyed by the conductors 112a, 112b runs perpendicular to the orientation of the magnetic field(s). In other embodiments, the read current runs parallel with or askew to the orientations of one or more magnetic fields of the memory element 110. As will be appreciated, generally larger currents through the conductors 112a, 112b may also be used to write the memory element 110, alone or in combination with the writing of the conductor 114. Thus, besides functioning to read the memory element 110, the conductors 112a 112b could, according to embodiments of the present invention, also function as word lines to write the memory element. In the illustrated embodiment, however, the conductors 112a, 112b are dedicated read lines that only function to read the state of the memory element 110.

Generally speaking, a first resistance of the magnetic memory element 110 corresponding to one or more magnetic fields in a first orientation represents a first switch state or bit state, such as a "0", and second resistance of the memory element corresponding to one or more magnetic fields in a second orientation represents a second switch state or bit state, such as a "1", which states are detectable via the read lines. In this manner, the conductors 112a, 112b are used to determine the binary bit state of the memory element 110. In sum, each orientation of the magnetic fields is associated with a switch or bit state ("1" or "0"), and the size of the current through the memory element, i.e., the resistance, is used to detect this state. It will be appreciated that, although specific reference is made to binary bit states (i.e., a "0" and a "1" state), the magnetoresistive memory device 100 and various memory devices formed according to embodiments of the invention can use multi-state logic, such as trinary and quaternary logic systems, by measuring various combinations of magnetization states or changes to such states.

The memory element 110 of the magnetoresistive memory device 100 may be any one of a number of conventional memory elements, such as those disclosed in the above-referenced and incorporated U.S. patents. Hence, embodiments of the memory element 110 fabricated in accordance with the present invention may include a single or repeating sandwich structure in which layers of ferromagnetic material are spaced apart by one or more layers of conductive and/or insulative material. In embodiments of magnetoresistive memory devices fabricated in accordance with the present invention, the memory element is a pinned giant magnetoresistive memory element, an unpinned giant magnetoresistive memory element, or other suitable memory element. In an embodiment where ferromagnetic layers of the memory element 110 are separated by a conductive, non-magnetic layer, the resistance of the memory element is a function of conduction electron spin-dependent scattering at the boundaries between the conductive and magnetic layers, (i.e., the spin value effect). When electron scattering is maximized due, for example, to anti-parallel magnetic fields in the adjacent layers, the resistance across the memory element is maximized. When the magnetic fields are in-line (i.e., parallel and having the same orientation), electron scattering is at a minimum, as is the resistance. Examples of conductive material for such conductive layers may include, for example, Cu, Au, Pt, and Ag or other suitable conducting materials. Examples of insulative material for such insulative layers may include, for example, AlN, SiN, and $SiO_2$ or other suitable insulating materials.

In accordance with embodiments of the present invention, the layers of memory elements, such as memory element 110, may be in the form of annular rings, planar disks, or other known configurations. In some embodiments, some of the ferromagnetic layers may have differing magnetic hardnesses. For example, according to some embodiments, one of the ferromagnetic layers is magnetically hard (having a higher coercive field), i.e., antiferromagnetically pinned, and another one of the ferromagnetic layers is softer (having a lower coercive field) than the pinned layer. The soft ferromagnetic layer is typically formed from a material such as Fe, Co, or Ni, for example, and their alloys and oxides. The hard ferromagnetic layer is typically formed from a material such as an alloy of Cr or Mn, for example. Although other materials will suffice, the hard ferromagnetic rings are typically selected from the alloys described in U.S. Pat. No. 4,402,770 and the soft magnetic alloys are selected from the alloys described in U.S. Pat. No. 4,409,043, the entire disclosures of which are hereby incorporated by reference.

Besides being sensitive to the orientation of the writing field, the manipulation of the magnetic field of one or more layers of the memory element described above is due to the sensitivity of the magnitude of a writing field generated by a writing current. For example, a writing field generated by a writing current will provide at least the coercive field of a softer ferromagnetic ring, but less than the coercive field of a hard or antiferromagnetically-pinned ferromagnetic ring. A reading field generated by a reading current will be less than the coercive fields of both softer and harder ferromagnetic rings. As will be appreciated, the manipulation of the magnetic fields is also below the current bar through which the current enters the stack. This arrangement will prevent any competing currents as all currents are now forced to pass one way through the elements.

In embodiments where one or more conductive layers separate ferromagnetic layers, the conductive layer or layers may be thick enough to essentially prevent all exchange coupling between the ferromagnetic layers or may be thin enough to permit exchange coupling. As is set forth above, the orientation of the magnetic fields of multiple ferromagnetic layers of the memory element 110 may be in-plane circular, in-plane radial, non-planar, or otherwise, before or after being manipulated by a writing operation.

In one or more embodiments of the memory element 110 in which layers of ferromagnetic material are separated by one or more layers of insulative material, the memory element is a magnetic tunneling junction (MTJ), or spin dependent tunneling type memory element. An insulative layer that separates at least two ferromagnetic layers acts as a tunnel barrier. The tunneling current across the sandwiched layers depends upon the magnetic arrangement of the magnetic moments of the magnetic layers and is higher when the magnetic moments are aligned parallel to one another, thus giving rise to a magnetic tunneling effect. In this embodiment, the read current preferably flows perpendicular to the layers of the memory element.

Figure 11:
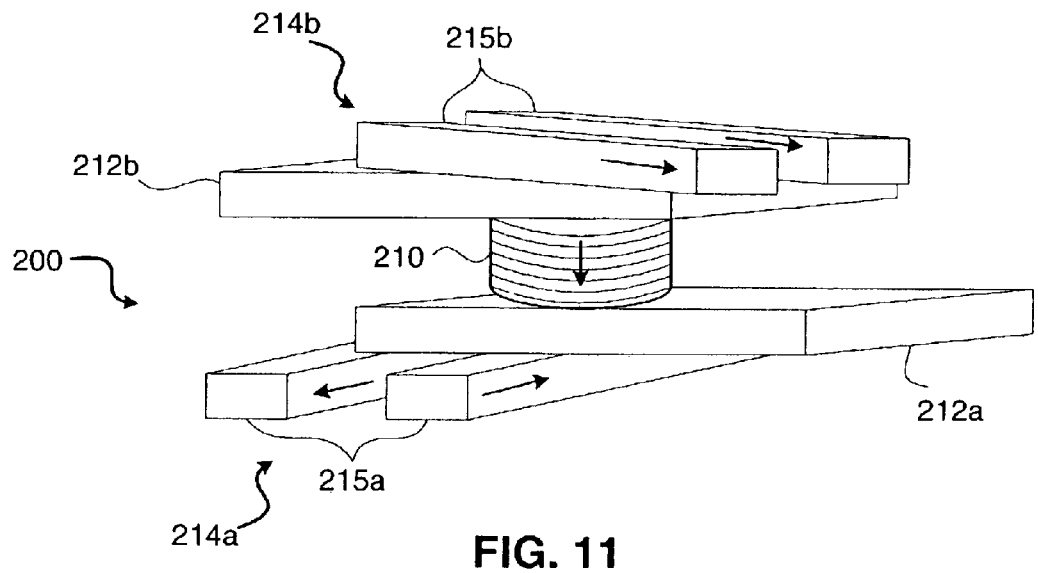
FIG. 11 is perspective representation of another embodiment of a magnetoresistive memory device fabricated in accordance with one or more methods of the present invention.
Figure 12:
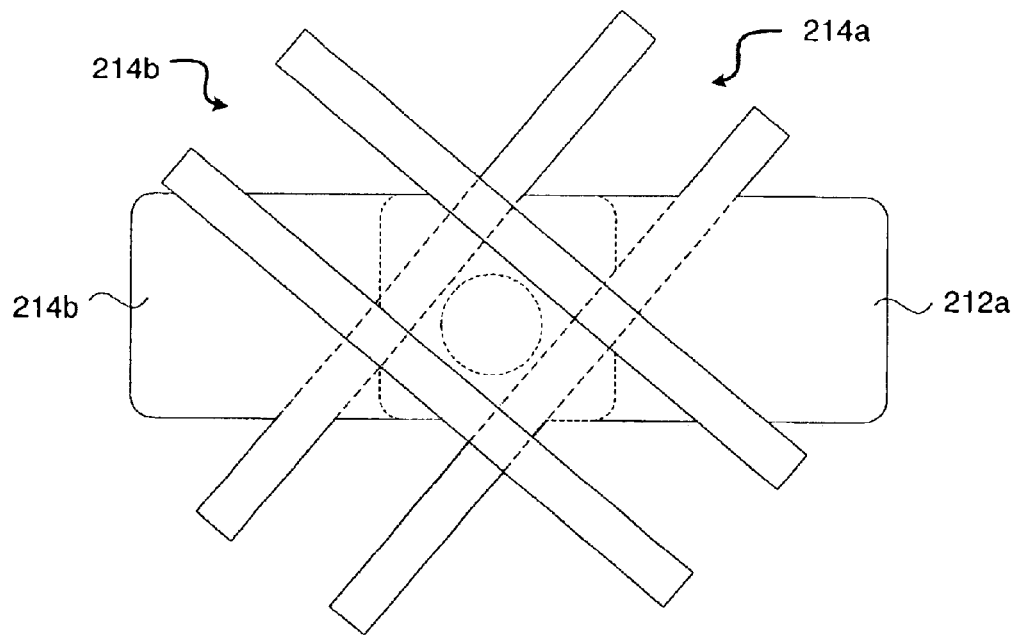
FIG. 12 is top view of the magnetoresistive memory device illustrated in FIG. 11.
Figure 13:
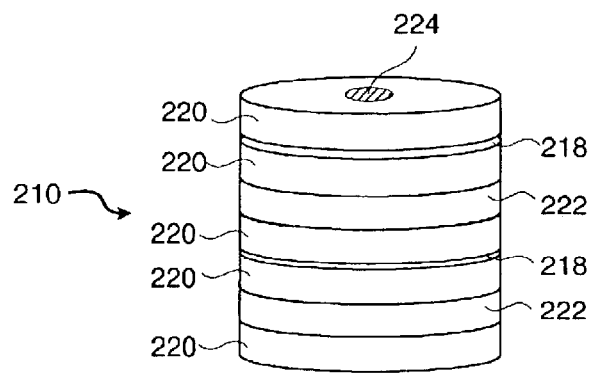
FIG. 13 is a perspective representation of a magnetic memory element of the magnetoresistive memory device illustrated in FIG. 11.

FIGS. 11–13 illustrate another embodiment of a magnetoresistive memory device 200 that may be fabricated in accordance with a preferred method of the present invention. As the magnetoresistive memory devices 100, 200 of FIG. 10 and FIGS. 11–13 are functionally similar and share a number of similar parts, like numbered parts of the magnetoresistive memory device 100 refer to like numbered parts of the magnetoresistive memory device 200, increased by one hundred. The magnetoresistive memory device 200 is a domain magnetic memory device and includes a memory element 210. For purposes of orientation, the magnetic memory element 210 is considered as having two sides, i.e., areas, separated by the midpoint of the magnetic memory element as measured along an axis parallel with the direction of read current through the memory element 210 (indicated by the downward arrow in the memory element 210). Hence, the memory element 210 includes a first conductor 212a located at a first side of the memory element 210 that acts to at least read the memory element 210. Located at a second side of the memory element 210 is a second conductor 212b that also acts to at least read the memory element 210. A third conductor 214b is also located at the second side of the memory element 210, where the third conductor acts to write the memory element 210. A fourth conductor 214a is located at the first side of the memory element 210, where the fourth conductor acts to write the memory element 210. According to various embodiments of the invention, the first conductor is formed before the fourth conductor.

As is illustrated in FIGS. 11 and 12, the third and fourth conductors 214a, 214b each are in the form of a pair of word lines 215a, 215b ("paired word lines" or "bit lines") that each generate a magnetic field that affects the memory element 210 for writing the memory element 210. In the preferred embodiment, the third and fefth fourth conductors 214a, 214b are generally orthogonal, which is more clearly illustrated in the top view illustrated in FIG. 12. Current in the paired word lines 215a, 215b flows in opposite directions, as indicated by arrows in each conductor 214a, 214b. The first conductor 212a and second conductor 212b are referred to a read lines or sense lines, and are used to query or read the state of the memory element 210.

The memory element 210 is an example of a current-perpendicular-to-plane device because current through the conductors 212a, 212b flows perpendicular to the magnetic fields of the memory element. The memory element 210 is illustrated in greater detail in FIG. 13 and includes a multilayer stack of magnetic rings. The memory element 210 exhibits a magnetoresistive effect that varies with the relative orientations of the magnetic fields of the magnetic rings in the stack.

As is illustrated in FIG. 13, the magnetic memory element 210 includes lower moment or soft magnetic layers 218, conductive layers 220, and higher moment or hard magnetic layers 222. This pattern of layers 218, 220, 222 may be repeated multiple times to form the memory element 210, as in the illustrated embodiment. As set forth above, the layers 218, 220, 222 may be, for example, CoFe (having thickness of approximately 1.5 nm or 2.5 nm) or Cu (having a thickness of approximately 4 nm). As is apparent, other materials may be used for the magnetic layers 218, 222, such as NiFeCo or other suitable materials. Each magnetic layer 218, 222 has a corresponding magnetic field orientation, i.e., the polarity or direction of magnetization in the layers. The magnetization configuration, according to embodiments of the invention, is preferably circular (e.g., clockwise or counter-clockwise).

As is described above, the higher moment magnetic layer 222 has a greater switching threshold and requires a higher switching field than does the lower moment magnetic layer 218. According to embodiments of the invention, the hard and soft magnetic layers 222, 218 may be made from the same materials but have different magnetic moments because of their different thicknesses. In such embodiments, thicker layers have a greater magnetic moment and require a greater magnetic field to switch it (i.e., the switching field). In other embodiments, the hard and soft magnetic layers may be made of different materials having different magnetic properties so that layers in both the hard set and the soft set can have substantially the same or similar thicknesses. The non-magnetic, conductive layers 220 can have various thicknesses, and may be relatively thick to reduce coupling between the magnetic layers 218, 222. As described above, in another embodiment, the conductive layers 220 may be replaced with insulating layers and the memory element 210 may be used in a magnetic tunneling junction (MTJ) device.

The electrical resistance of the magnetic memory element 210 varies depending on the relative orientations of the magnetic fields of the magnetic layers 218, 222. The change in resistance that may be experienced due to differences in magnetic polarities is increased as more magnetic layers are added to the memory element 210. In the illustrated embodiment there are four magnetic layers; however, more or fewer magnetic layers can be used in memory elements according to various embodiments of the invention. When the orientation of the magnetic fields of all magnetic layers 218, 222 is the same, the resistance of the memory element 210 is the lowest. When the orientation of the magnetic fields of the soft and hard magnetic layers 218, 222 are opposite, or anti-parallel, the resistance increases. These differences in resistance in the memory element 210 can be considered to indicate a bit or switch state of "1" or "0" stored in the memory element 210. The magnetization orientation of the hard layer set and the soft layer set can therefore be used in interrogating the state stored in the memory element 210. As mentioned above, in addition to binary logic states, the various magnetization orientations associated with the memory element 210 could be used to represent multiple logic states (e.g., logic states for trinary or quaternary logic systems).

Each layer 218, 220, 222 of the magnetic memory element 210 may be, for example, an annular ring that circumscribes a hole 224. As is illustrated in FIG. 13, the hole 224 passing through the annular layers may be filled with an insulative material, such as $SiO_2$, SiN or other suitable insulative materials. In alternative embodiments, a conductor may be passed within the holes 224 of the annular layers 218, 220, 224 such that it is in contact with the first and second conductors 212a, 212b on the first and second side of the memory element 210. In this embodiment, an insulating layer, such as $SiO_2$, SiN, or an oxide of the layers, is located between the layers 218, 220, 222 and the conductor within the holes. Additionally, embodiments having a conductor in the hole 224 of the memory element 210, the conductor may be electrically insulated from the rings of each layer 218, 220, 222. According to alternative embodiments, each of the layers 218, 220, 222 may be devoid of any holes (e.g., solid planar disk, etc.).

Current flowing through each of the paired word lines 215a, 215b generates an outward radial magnetic field (or an inward magnetic field if the current directions are reversed) around the memory element 210. If the paired word lines 215a, 215b are centered on either side of the memory element 210 and each word line is approximately the same size and carries approximately the same current, the radial magnetic field produced is approximately uniform around the memory element 210. The radial magnetic field produced by the wordline pairs 215a, 215b facilitates changing the polarity of the magnetic fields of the magnetic layers 218, 222, or a subset of the magnetic layers (e.g., the soft magnetic layers 218), in the magnetic memory element 210 by creating a state in the memory element wherein a relatively small, circular magnetic field (as generated by current through conductors 212a, 212b) will produce reliable and repeatable switching of the polarity of the memory element 210. More specifically, the current field of the paired word lines 215a, 215b "guides" the switching and the actual switching is driven by the field generated by current passing through the conductors 212a, 212b. The combination of the paired word lines 215a, 215b and the current through the conductors 212a, 212b provides for reliable switching. The direction of current in the conductors 212a, 212b and the resultant direction of the magnetic field generated thereby, determines whether the affected hard and/or soft sets of magnetic layers 218, 222 take on a clockwise magnetization configuration or a counterclockwise magnetization configuration.

With no current or very little current through the conductors 212a, 212b (and therefore no magnetic field or very little corresponding magnetic field) the memory element 210 is in a state where both the hard layer sets 222 and the soft layer sets 218 are magnetized in the same circular orientation (e.g., both with clockwise magnetization). When current flows through the conductors 212a, 212b to write the memory element 210, it does so according to embodiments of the invention in a direction such that the circular magnetic field it produces inside the memory element 210 is opposing the initial magnetization direction of the memory element according to embodiments of the invention.

As the current through the conductors 212a, 212b increases in magnitude, the soft layer set 218 reverses its magnetization direction first, forming a different magnetization orientation (e.g., an anti-parallel magnetization orientation) between the soft layer sets 218 and the hard layer sets 222 resulting in a higher resistance state. As set forth above, the conductors 212a, 212b act to read the bit or switch state of the memory element 210. When the current through the conductors 212a, 212b causes the soft layer set 218 to reverse its magnetization orientation and create a high resistance state, the output voltage across the memory element 210 may be read by the conductors 212a, 212b and used to indirectly detect a resistance value, or a change in a resistance value.

The voltage associated with high resistance through the memory element 210 is indicative of the relatively opposed magnetization configuration of the hard and soft sets. For example, a bit state of "0" may be stored in the memory element 210 as the higher resistance state of the memory element 210. Further increasing the magnitude of the current through the conductors 212a, 212b can yield the switching of the hard layer set 222 also, thereby aligning the magnetization orientation of the hard and soft sets and reducing the resistance of the memory element 210. When the current through the conductors 212a, 212b causes both of the soft layer set 218 and the hard layer set 222 to reverse their magnetization orientation, causing the orientations to be aligned, and resistance in the memory element 210 is reduced. This reduced resistance can be detected as a lower voltage drop across the memory element 210 by measurements in the conductors 212a, 212b. For example, a bit state of "1" may be stored in the memory element 210 as the lower resistance state of the memory element 210. Those skilled in the art will recognize that the values of "1" and "0" could be switched to alternatively correspond to higher and lower resistance states, respectively. Additionally, the various combinations of magnetization configurations could be used to form alternative logic systems, such as a trinary- or quaternary-based logic system, each with its attendant advantages.

Reading data from the memory element 210 may be accomplished by creating a radial magnetic field around the memory element 210, setting the soft set 218 to a known magnetic orientation, measuring a first resistance through the memory element 210, then setting the soft set 218 to the opposite magnetic orientation, and measuring a second resistance through the memory element 210. In a binary system according to the embodiments of the invention, one of the resistance measurements of the memory element 210 will be greater than the other. The magnetic orientation of the hard set 222 can be determined from the resistance measurements because the resistance when the hard and soft sets are anti-parallel will be greater than when they are parallel. The described read operation relies on the change in the resistance, rather than the value of the resistance itself. In alternative embodiments, the state of the memory element 210 may be determined by measuring the value of the resistance of the memory element 210, instead of a change in resistance, or by voltage measurements of the voltage of the memory element 210.

Figure 14:
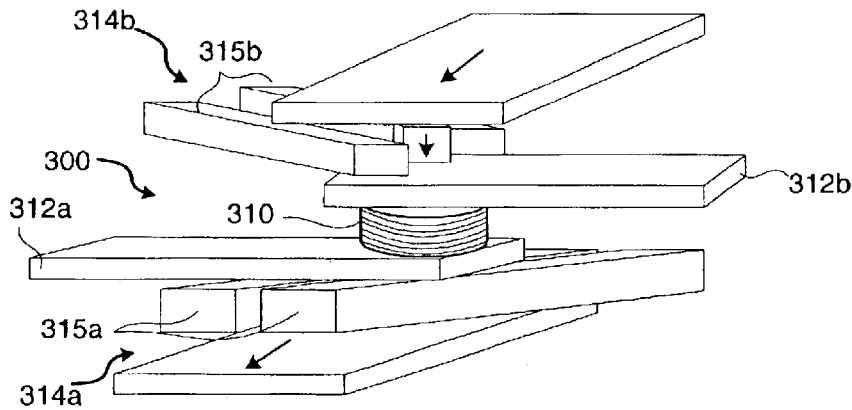
FIG. 14 is a perspective representation of a further embodiment of a magnetoresistive memory device fabricated in accordance with one or more methods of the present invention.
Figure 15:
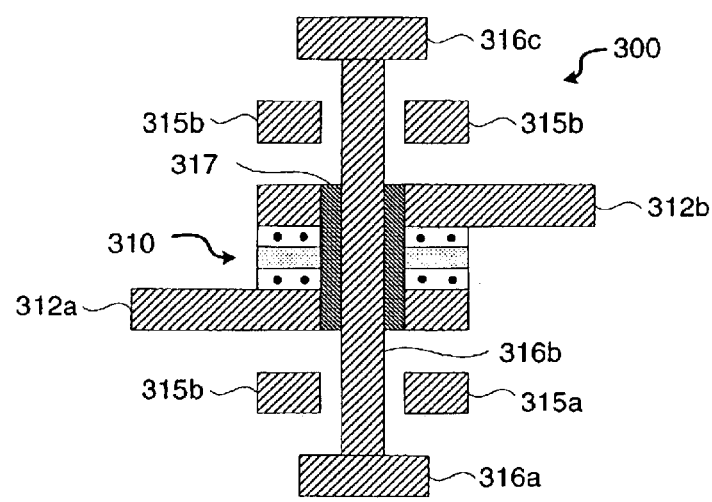
FIG. 15 is a cross-sectional view of the magnetoresistive memory device illustrated in FIG. 14.

FIGS. 14 and 15 illustrate another embodiment of a magnetoresistive memory device 300 that may be fabricated in accordance with methods of the present invention. FIG. 15 is a cross-sectional view of the memory device 300 shown in FIG. 14, taken through the center of the memory element 310. The magnetoresistive memory device 300 is a magnetic tunneling junction (MTJ) device and its memory element 310 includes a number of hard and soft annular magnetic layers that are separated from each other by one or more insulating layers (e.g., $Al_2O_3$, etc.). The illustrated embodiment includes conductors 314a, 314b in the form of paired word lines 315a, 315b (also referred to as bit lines or paired bit lines) that write the memory element 310, conductors 312a, 312b (referred to as read lines or sense lines) that read the memory element 310, as well as conductors 316a, 316b, 316c that also function to write the memory element. The conductor 316b passes through the center of the memory element 310 (e.g., through holes circumscribed by rings that form the memory element 310) and is insulated from the memory element 310 by an insulative barrier 317 of insulative material. The conductor 316b generates a magnetic field during read and write operations and sets the magnetization configuration in one or both of the soft and hard sets of magnetic layers, as described above. The conductors 312a, 312b are electrically connected to the memory element 310 and are used to measure changes in resistance of the memory element 310 during read operations. As pointed out above, changes in the resistance of the memory element 310 can be measured indirectly (e.g., by measuring discrete resistance values or voltage values over time). In alternative embodiments, the magnetoresistive memory element 310 does not include the separate writing conductors 316a, 316b, 316c, such that it is configured similar to the non-MTJ embodiment illustrated in FIGS. 11–13. Additionally, the separate conductors 316a, 316b, 316c may be used on the non-MTJ embodiment illustrated in FIGS. 11–13.

FIGS. 16–50 illustrate a specific method of fabricating one or more magnetoresistive memory devices in accordance with one or more embodiments of the present invention. As will be appreciated, the method described herein may be used fabricate the magnetoresistive memory devices 100, 200, 300 illustrated and described above as well as other magnetoresistive memory devices not described herein. In sum, the methods of the present invention concern methods of fabricating magnetoresistive memory devices in which the uniformity of material upon which a magnetic memory element is later formed is relatively precise as compared to some conventional manufacturing techniques thereby providing advantageous performance results. As set forth immediately below, these methods have several general characteristics according to embodiments of the invention.

First, in accordance with one or more methods, a magnetoresistive memory device is fabricated, where the magnetoresistive memory device has a magnetic memory element and a plurality of conductors for at least one of reading and writing the magnetic memory element. The plurality of conductors include a first conductor at least partially located at a first side of the magnetic memory element for reading the magnetic memory element, a second conductor at least partially located at a second side of the magnetic memory element for reading the magnetic memory element, a third conductor at least partially located at the second side of the magnetic memory element for writing the magnetic memory element, and a fourth conductor at least partially located at the first side of the magnetic memory element for writing the magnetic memory element. In the method the first conductor is formed before the fourth conductor.

Second, in accordance with one or more methods, at least a first conductor for at least reading a magnetic memory element of the magnetoresistive memory device is first formed. Then, the magnetic memory element is formed. Thereafter, at least a second conductor for at least reading the magnetic memory element is formed. Then, at least a third conductor for at least writing the magnetic memory element is formed at one side of the magnetic memory element. Thereafter, at least a fourth conductor for at least writing the magnetic memory element is formed at another side of the magnetic memory element that is opposite from the one side.

Third, in accordance with one or more methods, a subassembly of the magnetoresistive memory device is formed, where the formed subassembly includes a magnetic memory element of the magnetoresistive memory device. The subassembly is then inverted, and at least a portion of the magnetoresistive memory device is formed on the inverted subassembly, where the portion includes at least one conductor for at least one of reading and writing the memory device.

Fourth, in accordance with one or more methods, a first read line is formed for at least reading a bit state of a magnetic memory element of the magnetoresistive memory device. After the first read line has been formed, the magnetic memory element of the magnetoresistive device is formed. After the magnetic memory element is formed, a second read line for at least reading the bit state of the magnetic memory element is formed, where the first read line is located at a first side of the magnetic memory element and the second read line is located at a second side of the magnetic memory element that is opposite from the first side. After the second read line is formed, at least one word line for at least writing the magnetic memory element is formed at the first side of the magnetic memory element.

Fifth, in accordance with one or more methods, a subassembly of the magnetoresistive memory device is formed on a first substrate, where the subassembly includes a magnetic memory element of the magnetoresistive memory device. The formed subassembly is then attached to a second substrate. A remaining portion of the magnetoresistive memory device is then formed, where the remaining portion includes at least one conductor for at least one of reading and writing the magnetic memory element.

Sixth, in accordance with one or more methods, a donor substrate process is utilized during the forming of a magnetic memory element and a plurality of conductors of a magnetoresistive memory device, where the plurality of conductors are for reading and writing the magnetic memory element.

Figure 16:
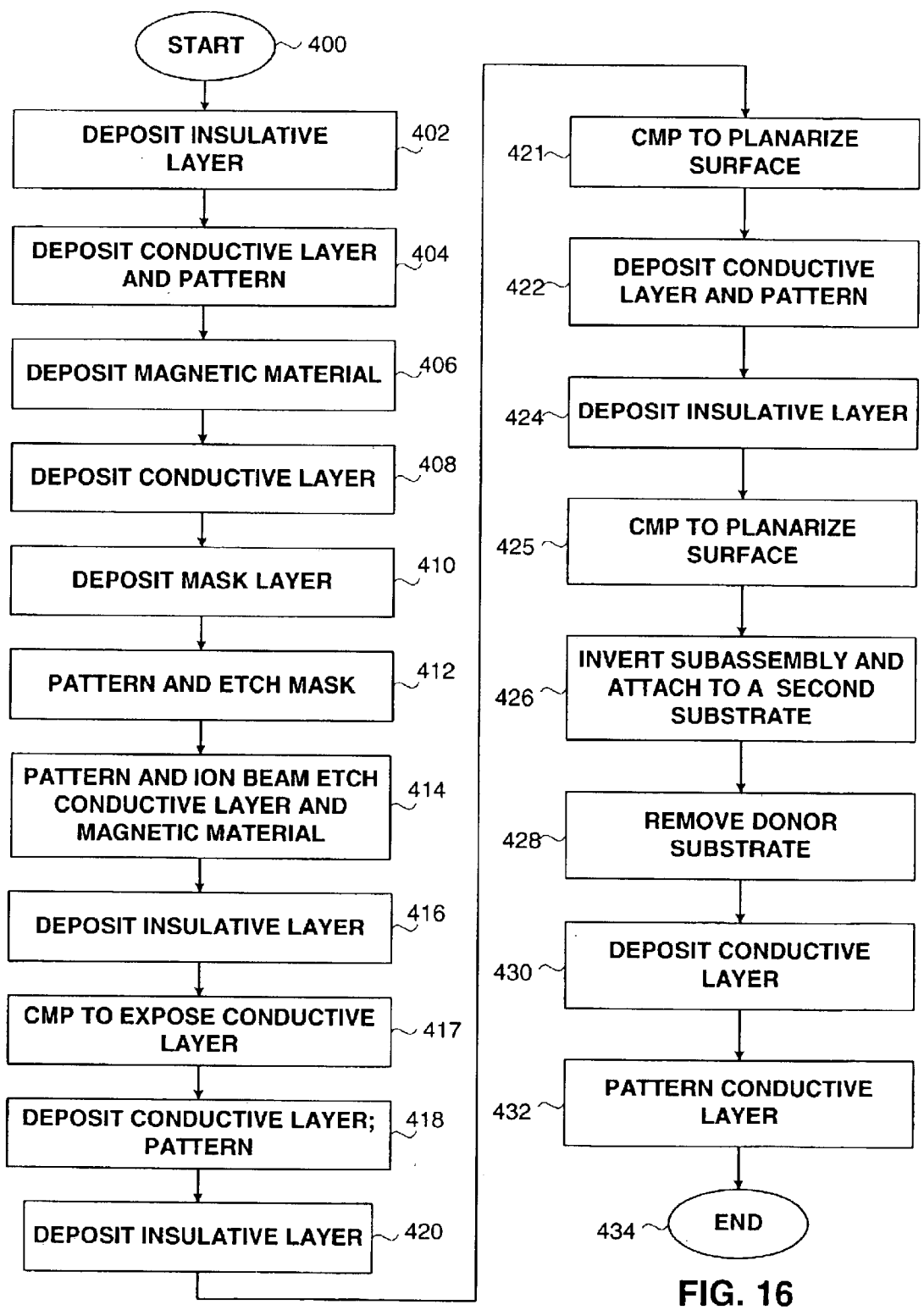
FIG. 16 is a flow chart illustrating one technique of fabricating a magnetoresistive memory device in accordance with one or more embodiments of the present invention.

For purposes of illustration, one specific technique of the present invention is illustrated in FIG. 16 and described below in reference to the fabrication of the magnetoresistive memory device 200 illustrated in FIGS. 11–13. FIGS. 17–50 illustrate the magnetoresistive memory device 200 as it is being fabricated at successive points in time in a preferred method. As will be appreciated, many of the steps described below may be omitted and/or the order of such steps varied while still being encompassed by one or more aspects of the present invention.

Figure 18:
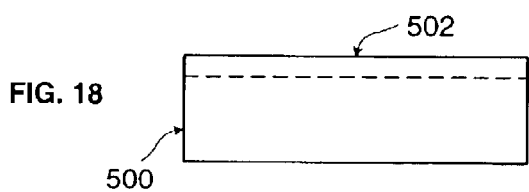
FIG. 18 is a cross-sectional view of the substrate illustrated in FIG. 17 taken along the line 18—18 in FIG. 17.
Figure 17:
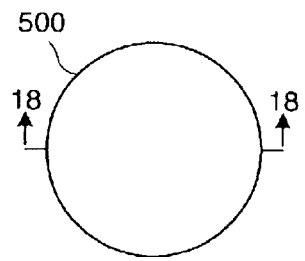
FIG. 17 is a top view of a substrate upon which a subassembly of a magnetoresistive memory device is fabricated in accordance with one embodiment of the present invention.

As is illustrated in FIGS. 17 and 18, the preferred method starts with a first substrate 500, upon which one or more layers of at least a portion of a magnetoresistive memory device is fabricated. The layers fabricated or otherwise formed on the substrate 500, as well as various other substrates according to the embodiment of the invention, may be "deposited" thereon by way of any number of suitable techniques, including but not limited to: chemical vapor deposition (CVD), sputtering, and epitaxial processes.

The substrate 500 may be a wafer, which can be formed from a semiconductor material, an insulative material, or other known materials. The substrate 500 will often include one or more layers or structures formed thereon and/or therein, such as one or more active or operable portions of a device. When the substrate 500 is used in connection with a second, handle substrate (or wafer) in a donor substrate process, it is referred to as a donor substrate (or wafer). Examples of suitable substrates include doped silicon substrates, silicon-on-insulator (SOI) substrates, silicon-on-sapphire (SOS) substrates, and thin film substrates. As is described further below, in the illustrated embodiment, the substrate 500 is suitable for cleaving. The substrate 500 illustrated in FIG. 18 has a predefined cleave interface 502, which is illustrated by the broken line. The cleave interface may be a variety of suitable cleave interfaces, such as an implanted zipper layer (e.g., an H+ implanted zipper layer) or an etch stop layer (e.g., for use in a silicon-on-insulator configuration). Additionally, the cleave interface 502 may be a predefined cutting location, where the substrate 500 is to be cut, thereby cleaving the substrate 500. According to embodiments of the present invention where the cleave interface 502 is an etch stop layer, the etch stop layer is configured to stop any standard etching processes carried out upon the substrate 500. Suitable substrates having cleavable interfaces are available from Silicon Genesis (SiGen) Corporation of San Jose, Calif. and Soitec of Grenable, France, for example.

The substrate 500 is used in the technique shown in FIG. 16, and exists from the start 400 of that process. As mentioned above, FIGS. 17–50 represent the device 200 at successive points in time during its fabrication according to the technique shown in FIG. 16. FIGS. 17–50 are described in pairs. The first figure of the pair is a top view of the substrate 500, and the second figure of each pair is a cross-sectional view taken along a specific line indicated in the first figure of the pair. Thus, FIG. 17 illustrates the top view of the wafer substrate 500 at the start 400 of the technique described in FIG. 16, and FIG. 18 illustrates a cross-sectional view of the substrate 500 at the same point in time taken along the line 18—18 shown in FIG. 17 and the figures are described together. This pattern of description is repeated for FIGS. 19–50.

Figure 20:
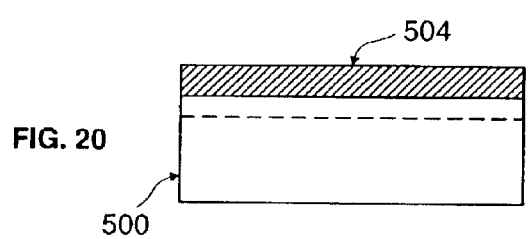
FIG. 20 is a cross-sectional view of the substrate illustrated in FIG. 19 taken along the line 20—20 in FIG. 19.
Figure 19:
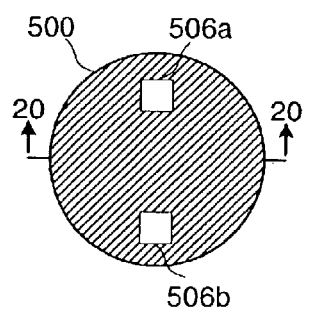
FIG. 19 is a top view of the substrate illustrated in FIG. 17 after an insulative layer has been deposited thereon.
Figure 22:
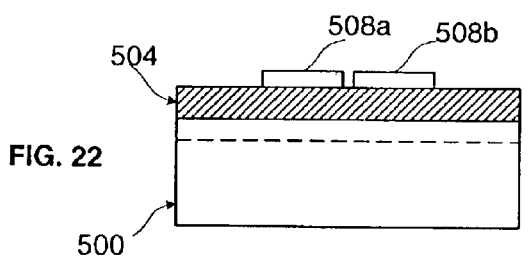
FIG. 22 is a cross-sectional view of the substrate illustrated in FIG. 21 taken along the line 22—22 in FIG. 21.
Figure 21:
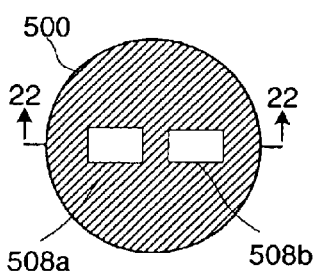
FIG. 21 is a top view of the substrate illustrated in FIG. 19 after a conductive layer has been deposited thereon and patterned.

In FIGS. 19 and 20, an insulative layer 504 is deposited on the substrate 500 in accordance with step 402 shown in FIG. 16. This insulation layer may be formed from a variety of substances that provide suitable insulation for use in integrated circuits. In accordance with an embodiment of the invention, the insulation layer 504 may comprise, for example, aluminum nitride (AlN). Alignment marks 506a, 506b may optionally be placed within the insulation layer 504 as needed to provide assistance in aligning the substrate 500 for patterning of various features. Although this optional step is not shown in FIG. 16, it could be incorporated with the steps of the techniques of this figure, if desired. Additionally, although these alignment marks 506a, 506b are shown only in FIG. 19, they could be used throughout the technique of FIG. 16, and would therefore be visible in subsequent figures showing the top view of the substrate 500.

In step 404 of the technique shown in FIG. 16, a conductive layer is deposited on the insulative layer 504, and is patterned to form sense (or read) lines 508a, 508b. These sense lines 508a, 508b may be formed from any suitable conductor. In accordance with an embodiment of the invention, the sense lines 508a, 508b are formed from copper (Cu). The conductive layer may be patterned using any one of a number of suitable techniques to form the sense lines 508a, 508b. According to embodiments of the invention, these sense lines comprise the first of several conductors to be used in connection with the memory elements (formed subsequently in the technique of FIG. 16), and are positioned at a first side of the memory elements.

Figure 24:
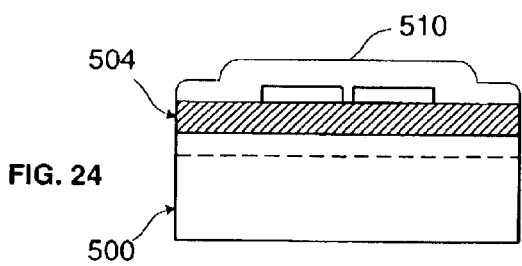
FIG. 24 is a cross-sectional view of the substrate illustrated in FIG. 23 taken along the line 24—24 in FIG. 23.
Figure 23:
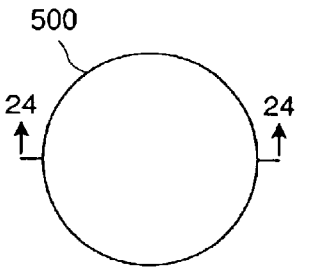
FIG. 23 is a top view of the substrate illustrated in FIG. 21 after a magnetic material has been deposited thereon.

After the sense lines 508a, 508b have been patterned, a magnetic material 510 is deposited, as shown in FIGS. 23 and 24, in connection with step 406 of FIG. 16. This magnetic material 510 may be a variety of magnetic materials suitable for a use in forming a magnetoresistive memory device. According to various embodiments of the invention, the magnetic material 510 may comprise magnetic multi-layers, for example, which can include multiple layers of soft and hard set magnetic materials (e.g., in the shape of annular rings, etc.) and additional layers dispersed between the magnetic layers (e.g., insulators, conductors, etc.).

Although the sense lines 508a, 508b are described above as being patterned before the magnetic material 510 is deposited, this need not be the case. According to some embodiments of the invention it may be desirable not to pattern the sense lines of 508a, 508b until after the magnetic material 510 is deposited. According to some of these embodiments, for example, the sense lines 508a, 508b may be patterned in step 414 of FIG. 16, when several of the layers are patterned and ion beam etched. According to other embodiments, the sense lines 508a, 508b may be etched at other suitable times during the technique illustrated in FIG. 16.

Figure 26:
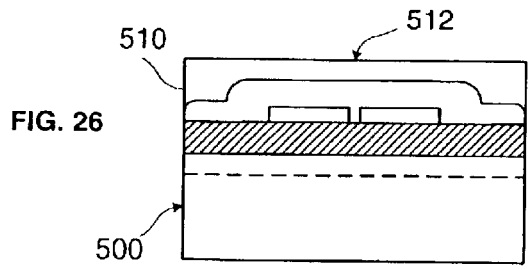
FIG. 26 is a cross-sectional view of the substrate illustrated in FIG. 25 taken along the line 26—26 in FIG. 25.
Figure 25:
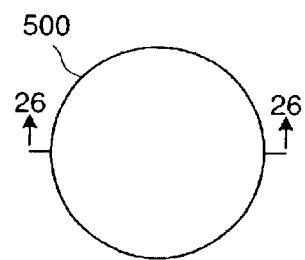
FIG. 25 is a top view of the substrate illustrated in FIG. 23 after a conductive layer has been deposited thereon.
Figure 28:
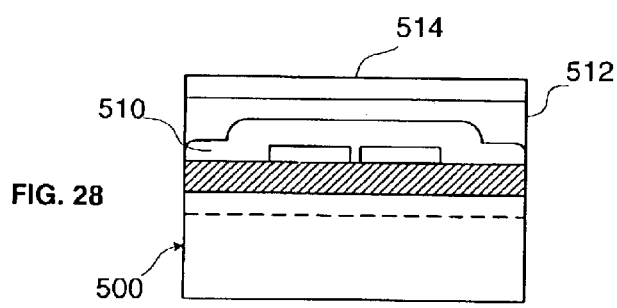
FIG. 28 is a cross-sectional view of the substrate illustrated in FIG. 27 taken along the line 28—28 in FIG. 27.
Figure 27:
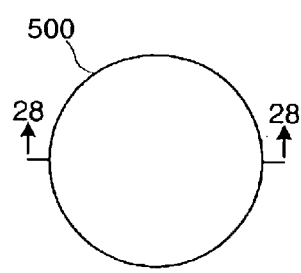
FIG. 27 is a top view of the substrate illustrated in FIG. 25 after a mask layer has been deposited thereon.
Figure 30:
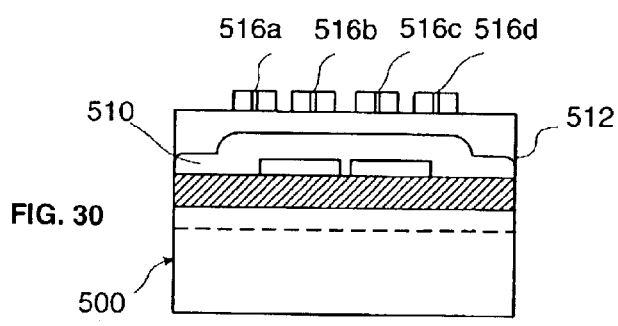
FIG. 30 is a cross-sectional view of the substrate illustrated in FIG. 29 taken along the line 30—30 in FIG. 29.
Figure 29:
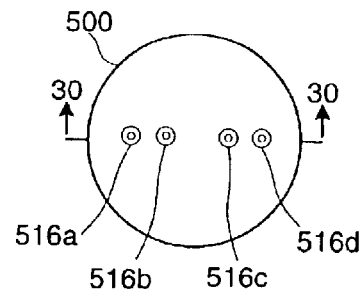
FIG. 29 is a top view of the substrate illustrated in FIG. 27 after the mask layer has been patterned and etched.

After the magnetic material has been deposited in step 406 of FIG. 16, a conductive layer 512 is deposited, as shown in FIGS. 25 and 26, and in connection with step 408 of FIG. 16. As with layers discussed previously, the conductive layer 512 may be formed from a variety of suitable materials (e.g., suitable conductors). According to embodiments of the invention, the conductor 512 may comprise, for example, a copper (Cu) layer. Once the conductive layer 512 has been deposited, a mask layer 514 is deposited, as shown in FIGS. 27 and 28, in accordance with step 410 of FIG. 16. The mask layer 514 is patterned and then etched, in step 412, to form device patterns 516a, 516b, 516c, 516d, as shown in FIGS. 29 and 30. The device patterns 516a, 516b, 516c, 516d take on the general form of the memory elements of the magnetoresistive memory devices. Specifically, in the embodiment shown in FIGS. 29 and 30, the device patterns are circular or annular in nature such that the memory elements will be circular, and have, in effect, multiple layers of rings having a hole through their centers (see FIG. 13).

Alternatively, the memory elements formed using the device patterns 516a, 516b, 516c, 516d shown in FIGS. 29 and 30 could be used to form other memory elements, such as the memory elements 110 and 310 described above in connection with FIGS. 10 and 14–15, respectively. Moreover, various types of memory elements, such as those not shown in the figures, or described in connection therewith, could be formed by way of the technique of FIG. 16, by using memory element device patterns 516a, 516b, 516c, 516d. For example, although not explicitly shown in the Figures, magnetic tunneling junction (MTJ) memory elements could be formed using these device patterns to create MTJ magnetoresistive devices.

Figure 32:
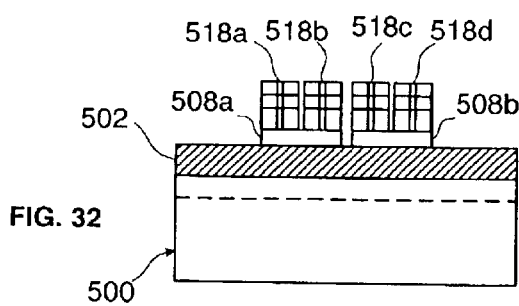
FIG. 32 is a cross-sectional view of the substrate illustrated in FIG. 31 taken along the line 32—32 in FIG. 31.
Figure 31:
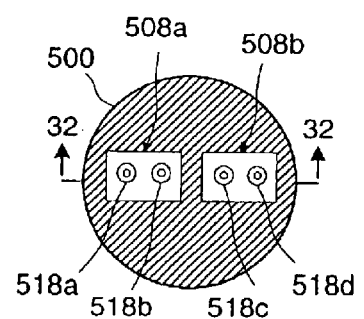
FIG. 31 is a top view of the substrate illustrated in FIG. 29 after the conductive layer and the magnetic layer have been patterned and etched.

In step 414 of FIG. 16, the conductive layer 512 and magnetic material 510 are removed by way of etching and/or an ion beam process everywhere except for where the memory element device patterns 516a, 516b, 516c, 516d are present. The result, shown in FIGS. 31 and 32, is memory elements 518a, 518b, 518c, 518d, positioned in pairs on each of the sense lines 508a, 508b. These memory elements 518a–518d each correspond to the memory element 210 described above in connection with FIG. 13. Although only four memory elements 518a–518d are shown in FIGS. 31 and 32, many devices may be formed by way of the process described herein. Thus, in cases where mass production and/or the cost of manufacture are key concerns, such as in very large scale integration (VLSI) techniques, the present invention may be used to create many devices in any variety of patterns and layouts.

Figure 34:
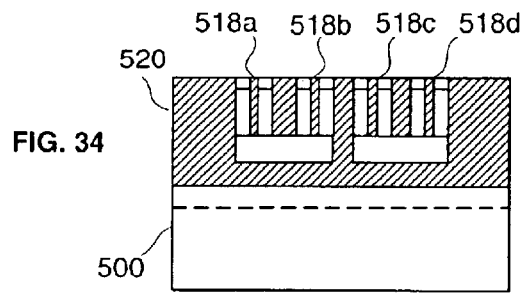
FIG. 34 is a cross-sectional view of the substrate illustrated in FIG. 33 taken along the line 34—34 in FIG. 33.
Figure 33:
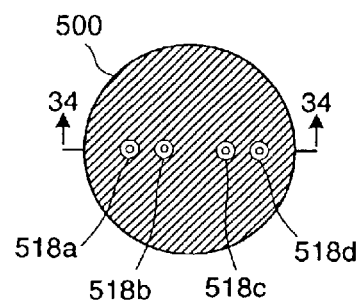
FIG. 33 is a top view of the substrate illustrated in FIG. 31 after depositing an insulator thereon.

In step 416 of FIG. 16, an insulative layer 520 is deposited over the entire surface of the substrate 500 and the memory elements 518a–518d formed thereon. The device patterns 516a, 516b, 516c, 516d and portions of the insulative layer 520 are removed until the conductive portions above each of the memory elements 518a–5118d are exposed, as shown in FIGS. 33 and 34. This may be accomplished, for example, by way of a chemical mechanical polishing (CMP) process that exposes the conductive layer, in step 417 of FIG. 16. Thus, in embodiments where copper is used as the conductor, copper rings above the memory elements 518a–518d are exposed through the insulator 520. According to various embodiments of the invention, the portions of the insulator 520 removed to expose the portions of the conductive layer above each of the memory elements 518a–518d may be removed by way of a polishing process, such as planarization or CMP, for example.

Figure 36:
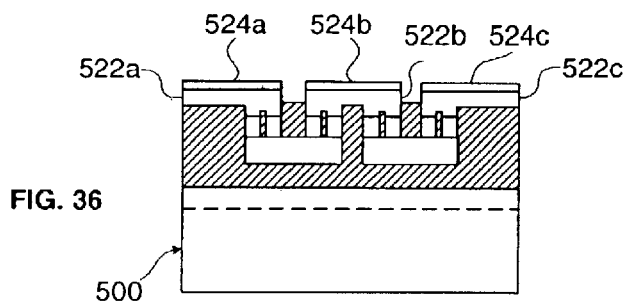
FIG. 36 is a cross-sectional view of the substrate illustrated in FIG. 35 taken along the line 36—36 in FIG. 35.
Figure 35:
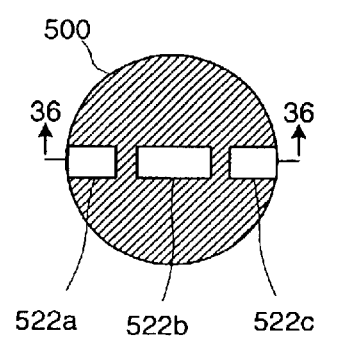
FIG. 35 is a top view of the substrate illustrated in FIG. 33 after depositing a conductive layer thereon, depositing a hard metal layer thereon, and then pattering the conductive layer and the hard metal layer.

In step 418 of FIG. 16, a conductive layer and an etch stop layer (e.g., a hard metal layer) are deposited and patterned to form second sense lines 522a, 522b, 522c (i.e., second conductors), at the second side of the memory elements (the first sense lines 508a, 508b being deposited on the first side of the memory elements, the first and second sides of the memory elements being opposite sides of the conductor). The second sense lines 522a, 522b, 522c are shown in FIGS. 35 and 36 as being deposited on top (i.e., the second side) of the memory elements 518a–518d. Portions of the hard metal layer deposited above the conductive layer remain above the formed sense lines 522a–522c, as hard metal segments 524a, 524b, 524c. Subsequently, in step 420 of FIG. 16, an insulative layer (not shown) is deposited over the second sense lines 522a–522c and the hard metal segments 524a–524c. The insulative layer can then be polished (e.g., by way of CMP) and the hard metal segments 524a–524c and exposing the second sense lines 522a–522c on the second side of the memory elements 518a–518d. The hard metal segments or other etch mask segments may be removed, for example, by way of reactive ion etching (RIE), or by way of various other techniques such as F-chemistry, which advantageously does not affect the conductive materials from which the second sense lines 522a–522c are formed. For example, in embodiments where the second sense lines 522a–522c are formed from copper, specific chemistry may be used that would etch the etch mask segments (e.g., hard metal segments 524a–524c), but that does not etch copper.

Figure 38:
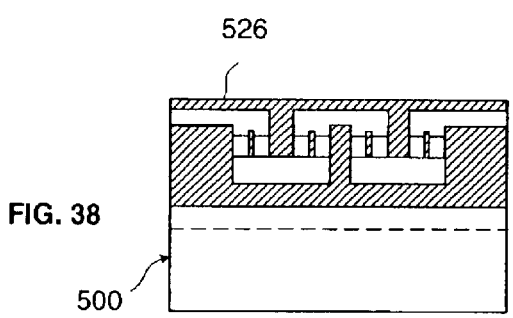
FIG. 38 is a cross-sectional view of the substrate illustrated in FIG. 37 taken along the line 38—38 in FIG. 37.
Figure 37:
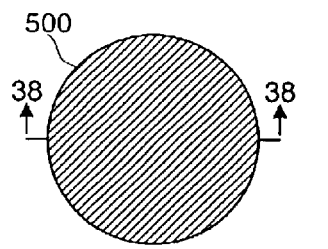
FIG. 37 is a top view of the substrate illustrated in FIG. 35 after depositing an insulator thereon.
Figure 40:
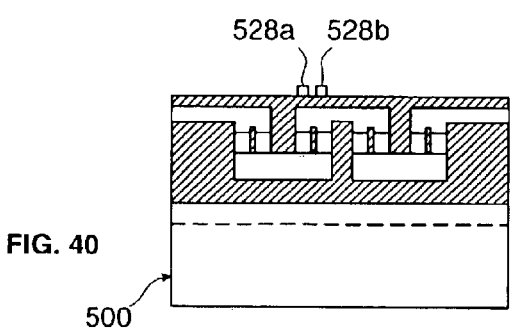
FIG. 40 is a cross-sectional view of the substrate illustrated in FIG. 39 taken along the line 40—40 in FIG. 39.
Figure 39:
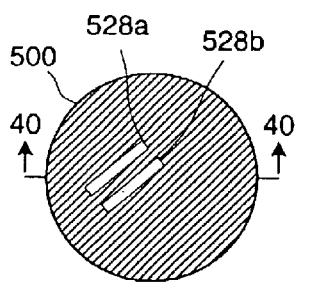
FIG. 39 is a top view of the substrate illustrated in FIG. 37 after a conductive layer has been deposited thereon and patterned.

Once the second sense lines 522a–522c have been exposed, then an insulative layer 526 is deposited, as shown in FIGS. 37 and 38, in step 420 of FIG. 16, and is planarized (e.g., by way of CMP, or another suitable technique) in step 421 of FIG. 16. A conductive layer is deposited on the insulative layer 526 and is patterned to form word (or bit) lines 528a, 528b (i.e., third conductors) at the second side of the memory elements 518a–518d, as shown in FIGS. 39 and 40, in step 422 of FIG. 16. Although only two word lines 528a, 528b are shown (i.e., one word line pair) for the sake of clarity so as not to not clutter the figures, multiple word lines can be formed by way of the invention. These word lines can, for example, be formed above each of the memory elements 518 formed by way of the various techniques of the invention. As with other conductive elements of the invention, the word lines 528a, 528b can be formed from any suitable conductor. According to embodiments of the invention, the word lines 528a, 528b, may be formed from copper, for example, or another suitable conductor. Once the word lines 528a, 528b have been patterned, an additional insulating layer 530 is deposited over the word lines, as shown in FIGS. 41 and 42, in step 424 of FIG. 16. Subsequently, in step 425 of FIG. 16, the surface is planarized by a suitable technique (e.g., CMP, etc.).

As shown in FIGS. 43 and 44, the subassembly 531, formed by way of the preceding steps of the techniques shown in FIG. 16, is inverted and attached to a second substrate 532. Although the subassembly 531 contains specific elements, and is formed by way of specific steps illustrated in FIG. 16, different steps varying from those shown in FIG. 16 could be used to obtain a subassembly having memory elements that is used in a donor substrate process. For example, according to embodiments of the present invention, the subassembly 531 used in a donor substrate process need only be made up of one or more memory elements 518a–518d. According to embodiments of the invention, the second substrate 532 may comprise a handle substrate, and the original substrate 500 may comprise a donor substrate. The donor substrate 500 and its subassembly 531 of devices may be attached to the donor substrate by way of a variety of techniques. For example, according to various embodiments of the invention, the subassembly 531 may be bonded to the second substrate 532, by way of a number of suitable bonding techniques including, but not limited to, plasma techniques, glass-frit techniques, anodic techniques, or thermocompression techniques, for example. The second substrate 532 may be any suitable substrate, such as conventional semiconductor substrates. For example, in accordance with an embodiment of the invention, the second substrate 532, or handle wafer, may comprise a silicon (Si) wafer. The attachment of the subassembly 531 to the second wafer occurs in step 426 of FIG. 16.

Figure 48:
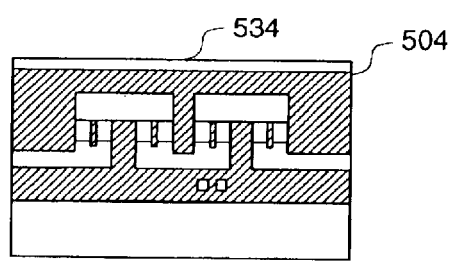
FIG. 48 is a cross-sectional view of the inverted subassembly illustrated in FIG. 47 taken along the line 48—48 in FIG. 47.
Figure 47:
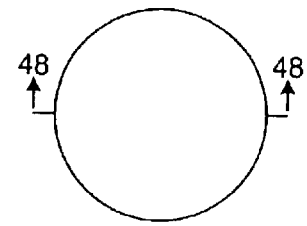
FIG. 47 is a top view of the inverted subassembly illustrated in FIG. 45 after deposition of a conductive layer.

Once the subassembly 531 has been attached to a second substrate 532, the donor substrate 500, or portions of the donor substrate, are removed in step 428 of FIG. 16, as shown in FIGS. 45 and 46. This is accomplished in the illustrated technique as the substrate 500 is divided along the predefined cleave interface 502, to remove a large portion of the substrate 500. The remaining portion of the donor wafer 500 may be removed, by way of any suitable removal technique. For example, in accordance with an embodiment of the invention, the remaining portion of the donor substrate 500 may be removed by way of an RWE technique. Once the entire donor substrate 500 has been removed, a conductive layer 534 is deposited on the exposed insulation layer 504, as shown in FIGS. 47 and 48, in step 430 of FIG. 16. The conductive layer 534 is then patterned in step 432 to form a second set of word lines 536a, 536b (i.e., the fourth conductors) at the first side of the memory elements 518a–518d. The second set of word lines 536a, 536b, as is the case with other conductors described above, can be formed from a variety of suitable conductors. For example, according to embodiments of the invention, the second pair of word lines 536a, 536b may be formed from copper, or another suitable conductor.

Once the second pair of word lines 536a, 536b has been patterned, the magnetoresistive memory devices are completely formed, having two sets of word lines, and two sets of sense lines on each of opposite sides of the memory elements. The multiple magnetoresistive memory devices formed by way of the technique of FIG. 16 correspond to the magnetoresistive memory device 200 shown in FIG. 11. Specifically, the memory element 210 corresponds to the memory elements 518a–518d. The first conductor, which is the first read line 212a at the first side of the memory element 210 corresponds to the first sense lines 508a, 508b, which are formed at the first side of the memory elements 518a–518d. The second read line 212b formed at the second side of the memory element corresponds to the second sense lines 522a, 522b, 522c (i.e., the third conductors) formed at the second side of the memory elements 518a–518d, the second side of the memory elements being opposite the first side of the memory elements. The third conductor, word line 215b is formed at the second side of the memory element 210, and corresponds to the word lines 522a, 522b, which are at the second side of memory elements 518a–518d. The fourth conductor, word line 215a, formed at the first side of the memory element 210 corresponds to the word lines 536a, 536b, formed at the first side of the memory elements 518a–518d. The fourth conductor is formed after the first conductor.

Figure 50:
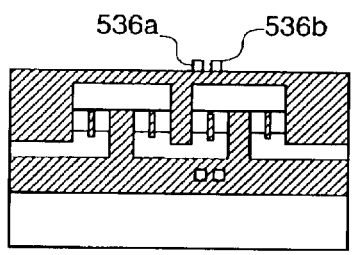
FIG. 50 is a cross-sectional view of the inverted subassembly illustrated in FIG. 49 taken along the line 50—50 in FIG. 49.
Figure 49:
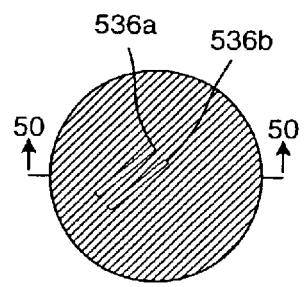
FIG. 49 is a top view of the inverted subassembly illustrated in FIG. 47 after the conductive layer has been patterned to complete the fabrication of a magnetoresistive memory device.

As is the case with each of the elements described above, many more word lines may be deposited than the two word lines 536a, 536b shown in FIGS. 49 and 50, including, for example, word line pairs for each of the memory elements 518. In this manner, multiple magnetoresistive devices may be formed by way of the process shown in FIG. 16 next to one another. Once the second set of word lines have been formed, the process shown in FIG. 16 ends 434. It should be noted that a protective or insulative layer will typically be deposited over the finished device to protect the second pair of word lines 536a, 536b. In addition to forming multiple devices on the same substrate essentially in a single row, the devices may be patterned into multiple configurations. For example, by way of the technique described in FIG. 16, magnetoresistive devices could form a two-dimensional array on a substrate. Additionally, multiple rows of magnetoresistive devices could be fabricated on top of one another, thereby allowing for a three-dimensional matrix of magnetoresistive devices. According to an exemplary embodiment of the invention, wherein multiple rows of devices are fabricated on top of one another to create a device matrix, the devices could be electrically connected in a configuration similar to that of a Wheatstone bridge configuration. Additionally, according to other embodiments of the invention, various suitable techniques for connecting the magnetoresistive devices either in a two-dimensional or three-dimensional configuration could be used according to the specific design constraints and requirements of the devices.

Therefore, the technique described in connection with FIG. 16, as well as techniques according to other embodiments of the invention advantageously provide a manner for fabricating magnetoresistive memory devices that avoids problems associated with prior approaches. Specifically, the present invention provides a technique whereby magnetoresistive devices may be formed having a high degree of uniformity, creating a uniformity of magnetic material that forms the magnetic memory element, as well as other parts of magnetoresistive memory device. The uniformity achieved by way of the present invention is relatively precise compared to some conventional manufacturing techniques. Specifically, by way of the technique described in FIG. 16, the fourth conductor is formed after the first conductor and a donor substrate process is used, avoiding the need for various polishing steps traditionally used in the manufacture of magnetoresistive memory devices, and consequently avoiding a number of undesirable artifacts caused by polishing (e.g., dishing effects, etc.). That is, by way of some embodiments of the invention, the face of the device and the face of conductors on the device show no indications or artifacts of a polishing process.

Figure 53:
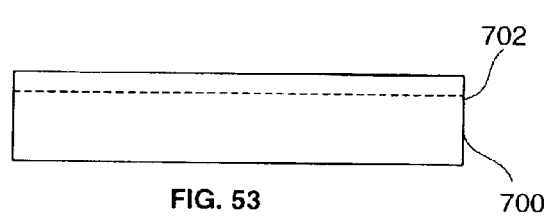
FIG. 53 is a cross-sectional view of the substrate illustrated in FIG. 52 taken along the line 53—53 in FIG. 52.

For purposes of illustration, a second specific technique for the fabrication of magnetoresistive devices according to embodiments of the present invention is illustrated in FIGS. 51A–51F, and described below in reference to the fabrication of a magnetoresistive memory device, such as the magnetoresistive memory devices 100, 200, 300 described in connection with FIGS. 10–14 above. FIGS. 52–101 illustrate the device at various consecutive time intervals during the device fabrication technique described in FIGS. 51A–51F. Similarly to FIGS. 17–50, FIGS. 52–101 are paired such that the first figure of the pair is a top view of the device at a given step of the formation process, and the second figure of the pair is a cross-sectional view of the device at the same interval, shown along a line illustrated in the top view shown in the first figure of the pair. For example, FIG. 53 is a cross-sectional view of the device shown in FIG. 52, taken along the line 53–53 shown in FIG. 52. The device shown in FIGS. 52 and 53 is at the same stage, or interval, of the production method. This pattern is repeated for the remainder of FIGS. 54–101, which are also described in pairs below.

The fabrication of the device described in connection with FIGS. 52–101 proceeds according to the technique shown in FIGS. 51A–51F. First, the process starts in step 600 of FIG. 51A with a substrate 700, as shown in FIGS. 52 and 53. The substrate 700 can be a variety of semiconductor substrates, for example, such as silicon (Si), or other suitable materials. As can be seen in FIG. 53, according to embodiments of the present invention, the substrate 700 may have a predefined cleave interface 702. This predefined cleave interface may comprise, for example, a zipper layer, such as a hydrogen-ion implanted zipper layer, according to various embodiments of the invention. Additionally, the cleave interface 702 may comprise, for example, an etch stop layer. This etch stop layer may be relatively thick (e.g., approximately 1 $\mu$m) and may comprise any suitable etch stopping interface to form such an etch stop layer. For example, in accordance with an embodiment of the invention, the etch stop layer may utilize a silicon-on-insulator (SOI) wafer, or the like. As discussed above, silicon substrates having a suitable cleave interface for use with embodiments of the invention are commercially available from several companies, including, for example, SiGen Corp. and Soitec.

Figure 51A:
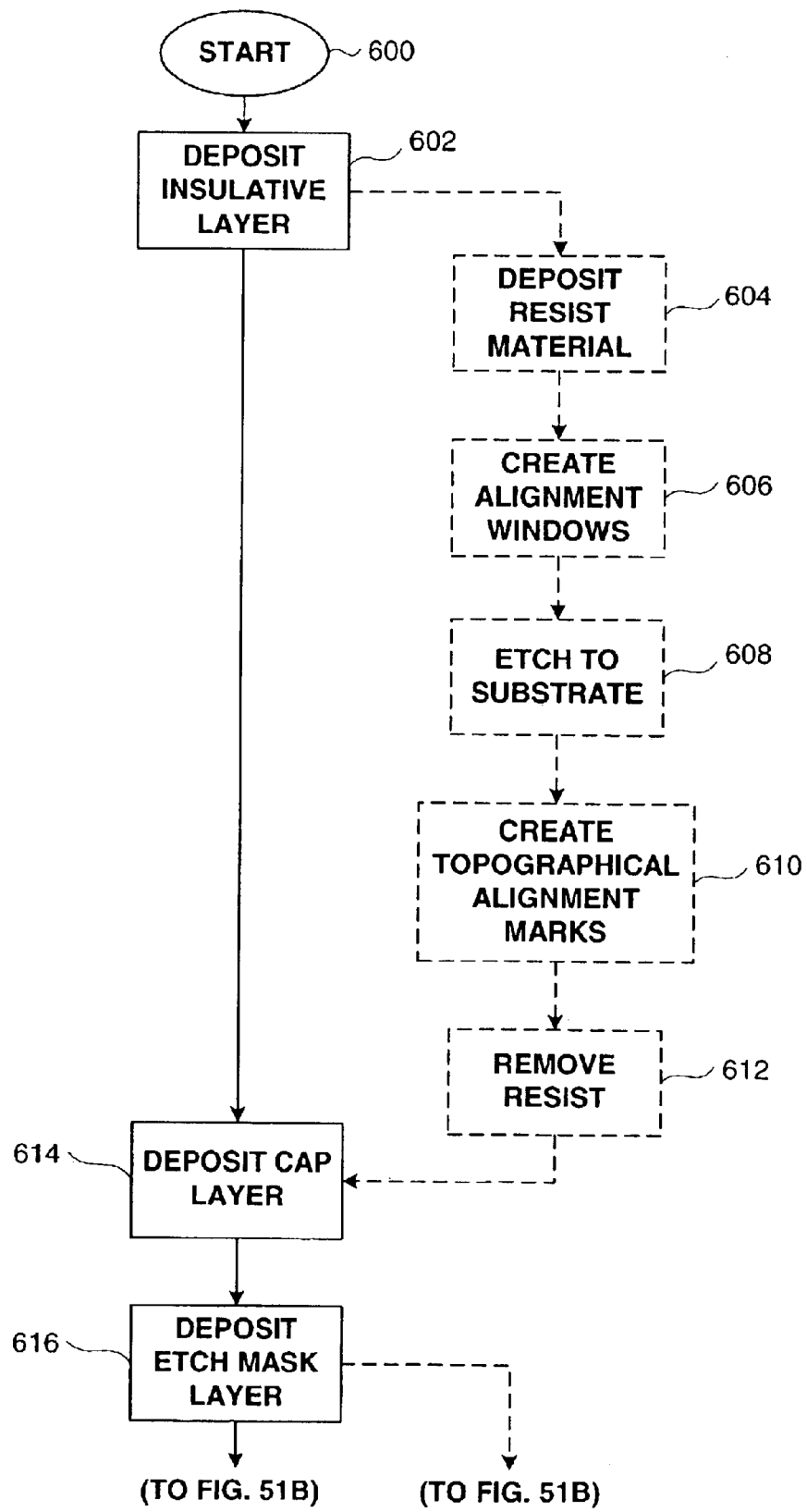
FIG. 51A is part of a flow chart illustrating one technique of fabricating a magnetoresistive memory device in accordance with one or more embodiments of the present invention.
Figure 52:
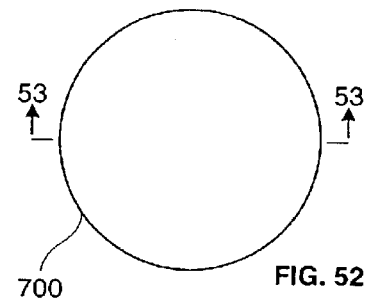
FIG. 52 is a top view of a substrate upon which a subassembly of a magnetoresistive memory device is fabricated in accordance with an embodiment of the present invention.
Figure 55:
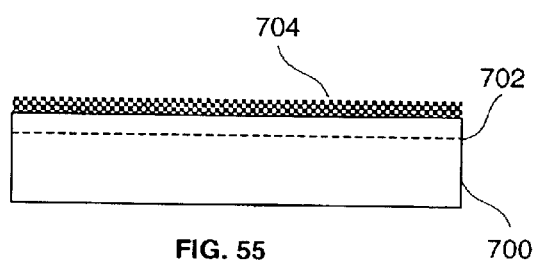
FIG. 55 is a cross-sectional view of the substrate illustrated in FIG. 54 taken along the line 55—55 in FIG. 54.
Figure 54:
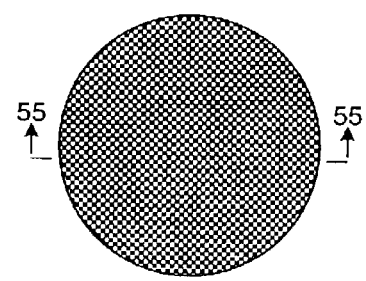
FIG. 54 is a top view of the substrate illustrated in FIG. 52 after deposition of an insulative layer.

In step 602 of FIG. 51A, an insulative layer 704 is deposited on the substrate 700, as shown in FIGS. 54 and 55. This insulative layer 704 may comprise a variety of materials suitable for electrically insulating the substrate 700 from devices deposited thereon. For example, in accordance with an embodiment of the invention, the insulative layer 704 may comprise an aluminum nitride (AlN) insulation layer. According to another embodiment of the invention, the insulative layer 704 may comprise other materials including materials described below as protective layers.

Figure 57:
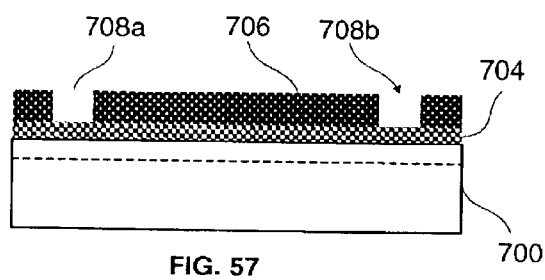
FIG. 57 is a cross-sectional view of the substrate illustrated in FIG. 56 taken along the line 57—57 in FIG. 56.
Figure 56:
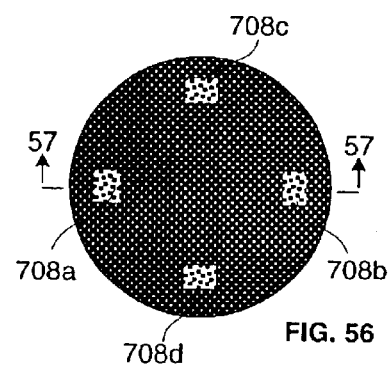
FIG. 56 is a top view of the substrate illustrated in FIG. 54 after resist material has been deposited thereon and alignment windows have been opened.
Figure 59:
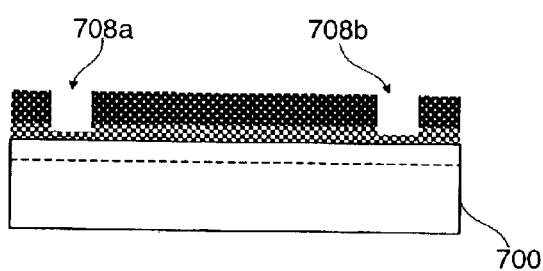
FIG. 59 is a cross-sectional view of the substrate illustrated in FIG. 58 taken along the line 59—59 in FIG. 58.
Figure 58:
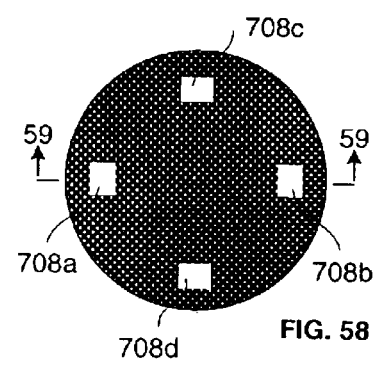
FIG. 58 is a top view of the substrate illustrated in FIG. 56 after etching.
Figure 61:
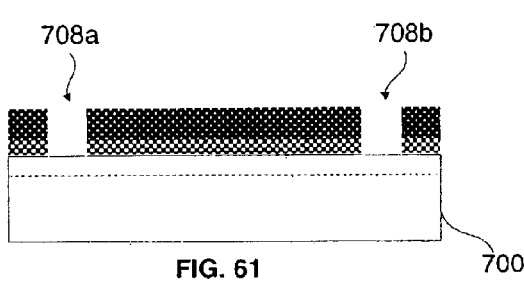
FIG. 61 is a cross-sectional view of the substrate illustrated in FIG. 60 taken along the line 61—61 in FIG. 60.
Figure 60:
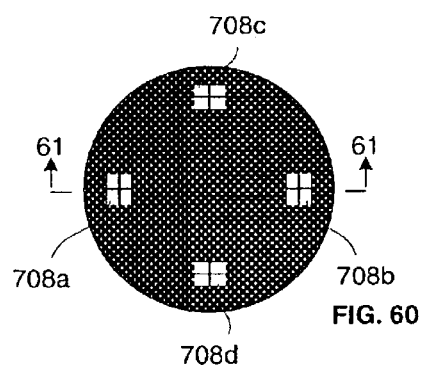
FIG. 60 is a top view of the substrate illustrated in FIG. 58 after alignment marks have been made.

In an optional step 604 of FIG. 51A, and as shown in FIGS. 56 and 57, a layer of resist material 706 may optionally be deposited on the insulative layer 704. According to an embodiment of the invention, alignment windows 708a, 708b, 708c, 708d may be patterned within the resist material 706, as shown by optional step 606 in FIG. 51 to provide directional and placement reference for convenience in manipulating the substrate 700, and collect placement of any devices deposited thereon. In accordance with embodiments of the invention making use of alignment windows, optional step 608 provides for etching the alignment windows 708a, 708b, 708c, 708d to the substrate 700, as shown in FIGS. 58 and 59. Topographical alignment marks may be added in optional step 610 of FIG. 51A, as shown in FIGS. 60 and 61, by etching part of the substrate 700 to form the necessary topographical marks. For example, in accordance with an embodiment of the invention, the topographical alignment marks can be etched in the wafer 700 to a depth of approximately 0.5 $\mu$m, or to any other depth suitable for creating the necessary topography and for providing adequate alignment capability. The resist material 714 is then removed in optional step 612 of FIG. 51A.

Although optional steps 604–612 of FIG. 51A, and related FIGS. 56–61 illustrate one possible technique of creating alignment marks to properly align the substrate 700 during the deposition and device fabrication technique, these steps are optional. A variety of other techniques could be used to maintain proper alignment of the substrate 700 during deposition and device formation, according to various embodiments of the present invention. For example, according to an alternative embodiment of the invention, metal marks could be deposited and etched to form alignment marks easily detected during photo or electron beam lithographic techniques. Additionally, numerous other techniques could be used to properly align the substrate 700 for deposition and device production. Thus, in place of optional steps 604–612 of FIG. 51A could be substituted steps of any suitable technique for providing alignment marks, or otherwise providing alignment capability for the substrate 700.

Figure 63:
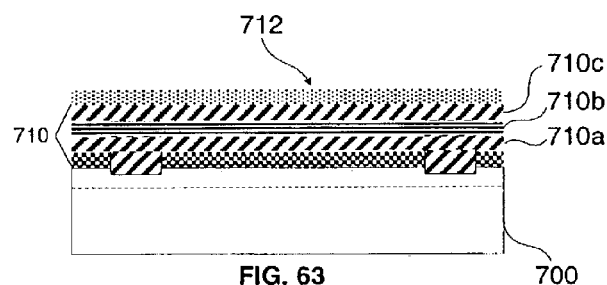
FIG. 63 is a cross-sectional view of the substrate illustrated in FIG. 62 taken along the line 63—63 in FIG. 62.
Figure 62:
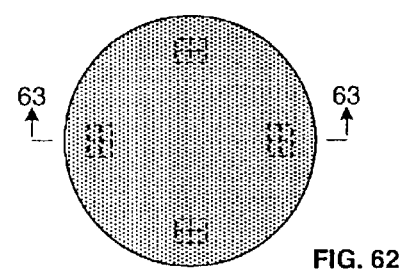
FIG. 62 is a top view of the substrate illustrated in FIG. 60 after deposition of a cap layer and an etch mask layer.
Figure 65:
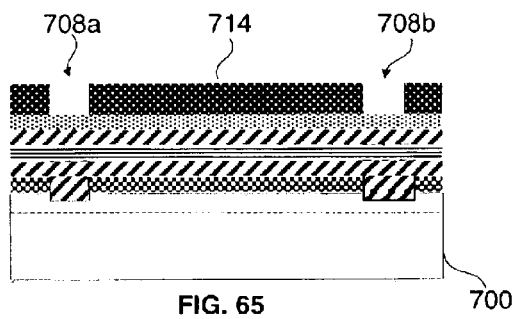
FIG. 65 is a cross-sectional view of the substrate illustrated in FIG. 64 taken along the line 65—65 in FIG. 64.
Figure 64:
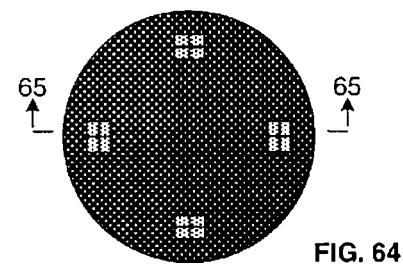
FIG. 64 is a top view of the substrate illustrated in FIG. 62 after resist material has been deposited and alignment windows have been opened.

In subroutine 614 of FIG. 51A, a device cap layer 710 is deposited on the substrate 700, as shown in FIGS. 62 and 63. In FIG. 62, although not visible from the top view, the alignment windows 708a–708d are illustrated by way of broken lines to indicate their location and position relative to the substrate 700. Similarly, in several cases below (but not in all cases), where elements are covered, they are illustrated by way of broken lines to indicate their position and orientation relative to other devices and the substrate 700.

The cap layer 710 deposited in subroutine 614 comprises multiple layers, which are generally deposited one layer at a time. Specifically, the cap layer comprises a first conductive layer 710a, a magnetic material 710b, and a second conductor layer 710c. The first conductive layer 710a is deposited at a first side of memory elements formed subsequently from the magnetic material 710b, and the second conductive layer is deposited at a second side (opposite the first side) of the memory elements. The magnetic material 710b may comprise multiple layers (e.g., a soft layer set and a hard layer set, and any other interspersed layers) used to form a memory element (e.g., such as the memory element 210 described above in connection with FIG. 13). According to an embodiment of the invention, the cap layer 710 may comprise a giant magnetoresistive (GMR) cap layer or a magnetic tunneling junction (MTJ) cap layer. The conductive layers 710a, 710c may comprise a variety of suitable conductors. For example, in accordance with an embodiment of the invention, the conductive layers 710a, 710c may comprise copper. Additionally, the magnetic material 710b of the cap layer 710 may comprise a variety of magnetic materials and layers suitable for forming a memory element of a magnetoresistive device.

An etch mask layer 712 is deposited, as shown in FIGS. 62 and 63, on the cap layer 710 in step 616 of FIG. 51A. This etch mask layer 712 may be made from a variety of materials suitable for forming an etch mask layer 712. For example, in accordance with an embodiment of the invention, the etch mask layer 712 may be a silicon nitride (SiN) etch mask layer. According to other embodiments of the invention, the etch mask layer 712 may comprise a hard metal layer, which can include a variety of different hard metals. After step 616 in FIG. 51A, the technique continues in FIG. 51B.

Figure 51B:
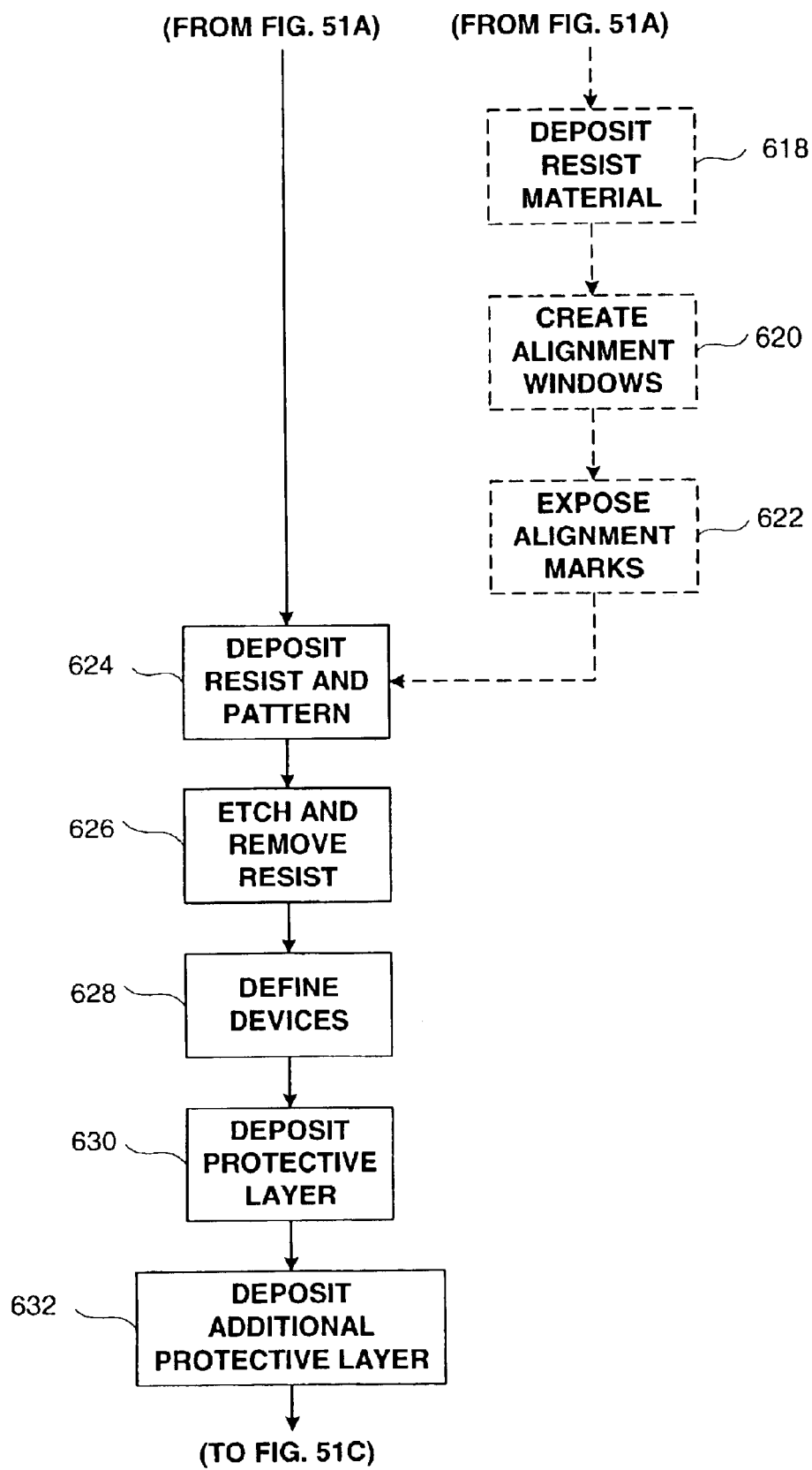
FIG. 51B is part of a flow chart illustrating one technique of fabricating a magnetoresistive memory device in accordance with one or more embodiments of the present invention.

The method continues in FIG. 51B, and may proceed according to optional steps 618–622 indicated by way of the broken line, or may either omit or replace the optional steps.

Figure 67:
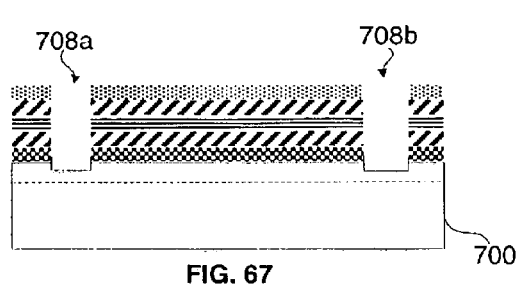
FIG. 67 is a cross-sectional view of the substrate illustrated in FIG. 66 taken along the line 67—67 in FIG. 66.
Figure 66:
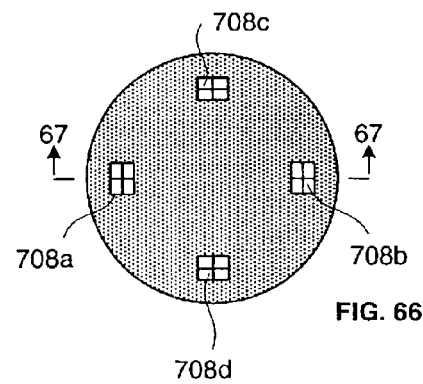
FIG. 66 is a top view of the substrate illustrated in FIG. 64 after alignment marks have been exposed.
Figure 69:
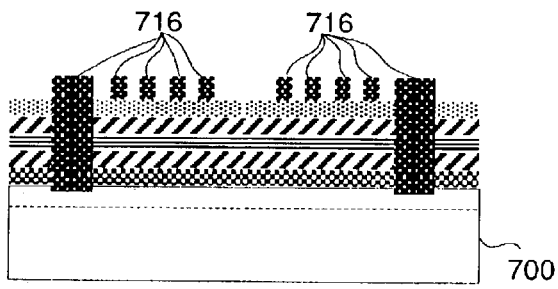
FIG. 69 is a cross-sectional view of the substrate illustrated in FIG. 68 taken along the line 69—69 in FIG. 68.
Figure 68:
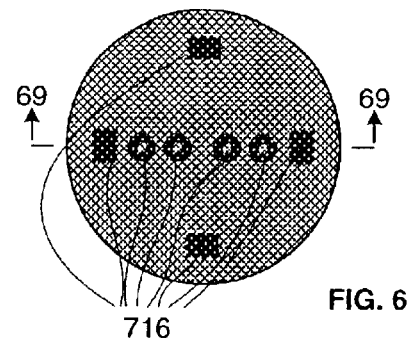
FIG. 68 is a top view of the substrate illustrated in FIG. 66 after resist material has been deposited and patterned.

For example, the optional steps 618–622 indicated in FIG. 51B may be replaced by another suitable technique for providing alignment of the substrate 700 and features deposited thereon. According to an embodiment of the invention, as shown in optional step 618 of FIG. 51B, resist material 714, shown in FIGS. 64 and 65, may be deposited on the etch mask layer 712. This resist material 714 may be deposited by way of a variety of suitable techniques, such as spinning the resist material 714 onto the etch mask layer 712, for example. After the resist material has been deposited in step 618 of FIG. 51B, alignment windows 708a–708d are opened in the resist material in optional step 620 of FIG. 51B. In optional step 622 of FIG. 51B, the topographical alignment marks etched in the substrate 700 are exposed in embodiments using alignment marks, as an etching process etches down to the substrate 700, as shown in FIGS. 66 and 67.

In step 624 of FIG. 51B, resist material 716 is deposited and patterned to define a hard mask for the memory elements of the magnetoresistive memory devices formed by way of the present invention. This resist material 716 can be seen in FIGS. 68 and 69. In these figures, the resist material fills the alignment windows 708a–708d, and is shaped in the form desired for the memory elements, which in the illustrated embodiment are circular (i.e., annular layers) with a hole in the center, as can be seen in the top view shown in FIG. 68 (see also FIG. 13).

Figure 71:
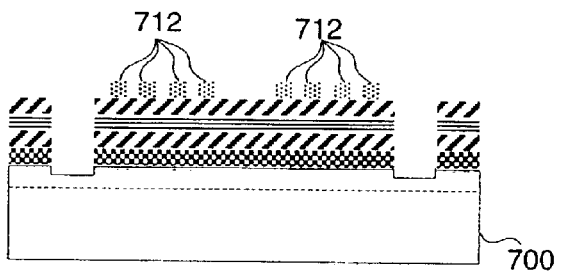
FIG. 71 is a cross-sectional view of the substrate illustrated in FIG. 70 taken along the line 71—71 in FIG. 70.
Figure 70:
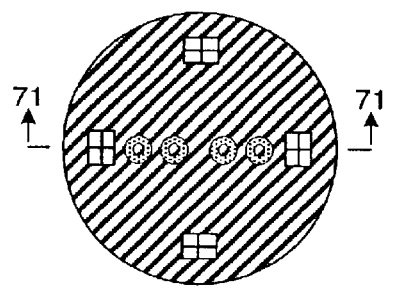
FIG. 70 is a top view of the substrate illustrated in FIG. 68 after etching and removing the resist material.
Figure 73:
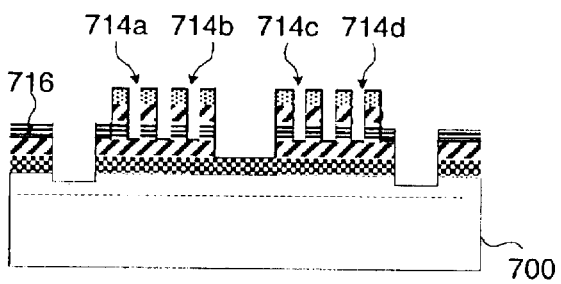
FIG. 73 is a cross-sectional view of the substrate illustrated in FIG. 72 taken along the line 73—73 in FIG. 72.
Figure 72:
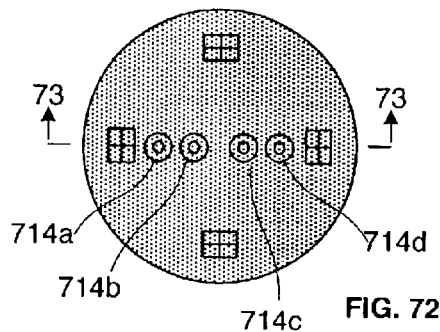
FIG. 72 is a top view of the substrate illustrated in FIG. 70 after devices have been defined and a protective layer has been deposited thereon.

Once the resist has been patterned in step 624 of FIG. 51B, the layers around the resist are etched, removing portions of the etch mask layer 712 not protected by the resist material 716, and the remaining resist material 716 is removed in step 626. Once the resist material 716 has been removed, as shown in FIGS. 70 and 71, portions of the etched mask layer 712 remain, and cover the area where the individual, circular memory elements will be formed. According to an embodiment of the invention, the etch mask layer 712 (i.e., the "hard" mask) is removed by way of a suitable removal process, such as reactive ion etching (RIE), or the like. RIE is a technique particularly suited to removing a hard mask layer, such as silicon nitride (SiN), or other similar hard mask layers. However, when other etch mask layers 712 are used, other suitable etching techniques may be used to create the mask for the memory elements of the magnetoresistive memory devices formed by way of the present invention.

After the hard mask layer 712 has been etched, in step 626 of FIG. 51B, the memory elements 714a, 714b, 714c, 714d are further defined, and a protective layer is deposited thereon in step 630. The memory elements, or devices 714a–714d, shown in FIGS. 72 and 73 may be defined by way of a variety of suitable techniques according to various embodiments of the invention. In accordance with a specific embodiment of the invention, the memory elements 714a–714d may be formed by way of an ion milling process, for example. The protective layer 716 deposited over the substrate 700 and all of the features deposited thereon (shown in FIG. 73 as a darker solid line over each of the memory elements 714a–714d, and the surrounding area on the substrate 700) in step 630 to prevent any oxidation, or other adverse reactions. Any suitable protective layer that would protect the memory elements 714a–714d and the entire substrate from oxidation or other adverse effects can be deposited in step 630. In accordance with a specific embodiment of the invention, the protective layer 716 deposited in step 630 is a silicon nitride (SiN) deposition layer, which serves to protect the substrate and all devices deposited thereon from oxidation. This protective layer 716 may be deposited in a variety of techniques, including, for example, in-situ deposition, or other suitable techniques, and is used to immediately protect the substrate and its devices from oxidation or other adverse effects.

Figure 75:
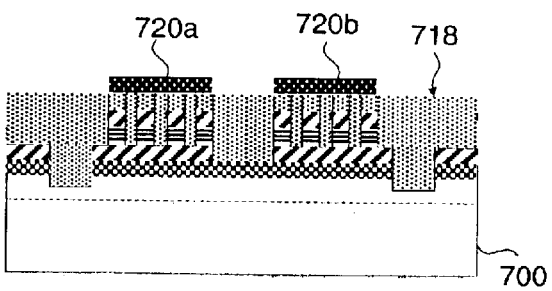
FIG. 75 is a cross-sectional view of the substrate illustrated in FIG. 74 taken along the line 75—75 in FIG. 74.
Figure 74:
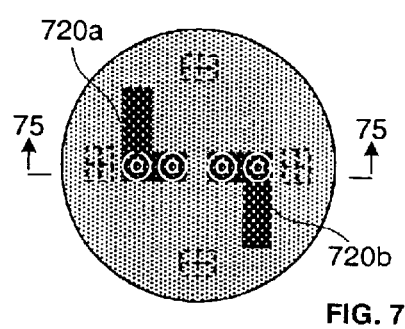
FIG. 74 is a top view of the substrate illustrated in FIG. 72 after an additional protective layer has been deposited and resist material has been deposited thereon and patterned.

After the thin protective layer 716 is deposited in step 630 of FIG. 51B, an additional protective layer 718 is deposited in step 632, as shown in FIGS. 74 and 75. This additional protective layer 718 may serve multiple purposes, including additional protection from oxidation and other undesirable effects. Additionally, the additional protective layer 718 deposited in step 632 may serve as an insulative layer, insulating the memory elements 714a–714d, from one another, and from other electrically conducting materials deposited on the substrate 700, or which come into contact therewith. For example, the additional protective layer 718 may be formed from silicon nitride (SiN), which achieves both objectives of protecting and insulating.

Figure 51C:
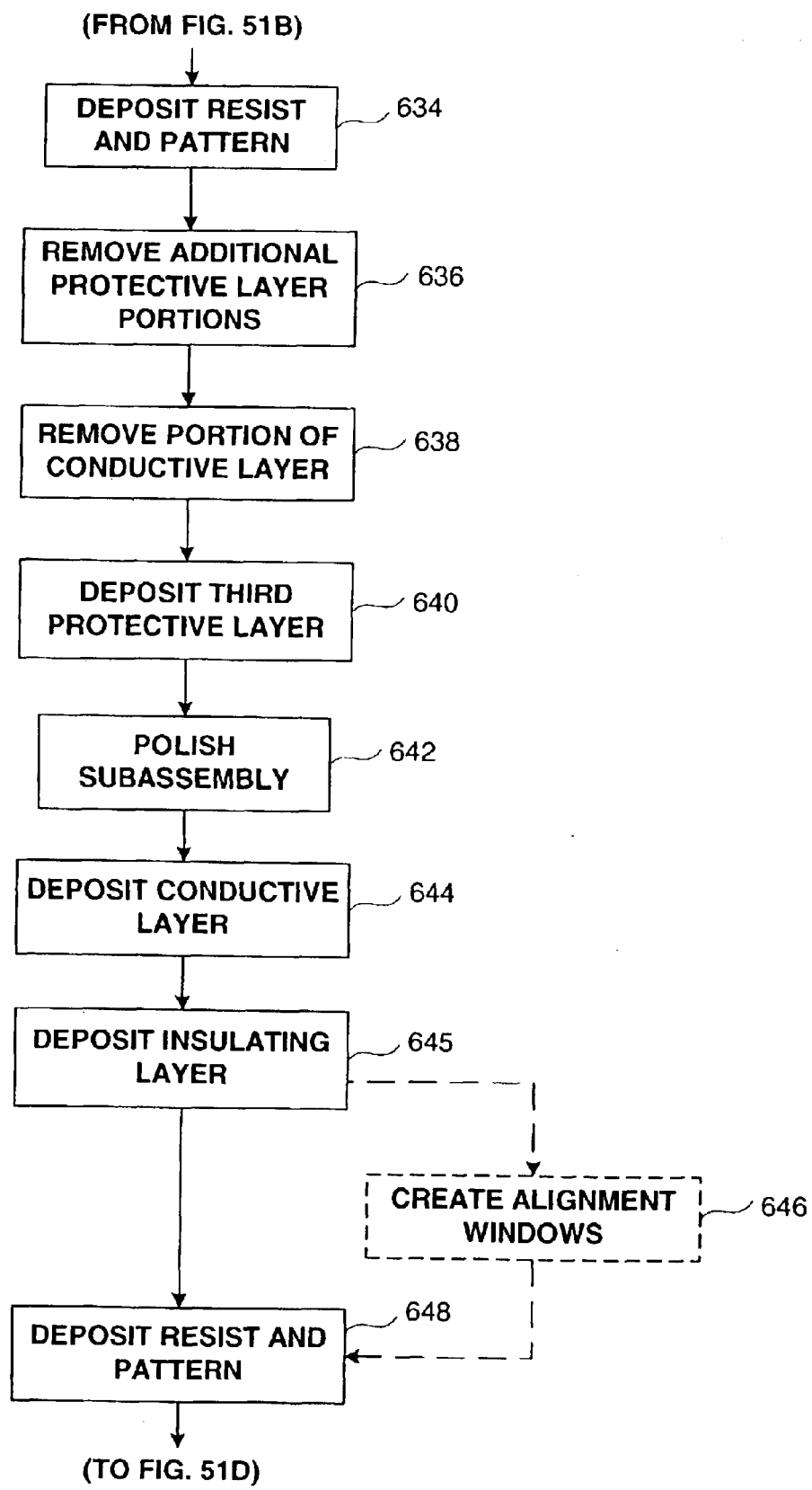
FIG. 51C is part of a flow chart illustrating one technique of fabricating a magnetoresistive memory device in accordance with one or more embodiments of the present invention.

After the additional protective layer 718 is deposited in step 632 of FIG. 51B, as shown in FIGS. 74 and 75, the technique continues in FIG. 51C, as resist is deposited in step 634 and patterned to define sense lines. Specifically, as can be seen with reference to FIGS. 74 and 75, the resist 720a, 720b is deposited and patterned to define the shape of sense lines of the magnetoresistive memory devices of the invention.

Figure 77:
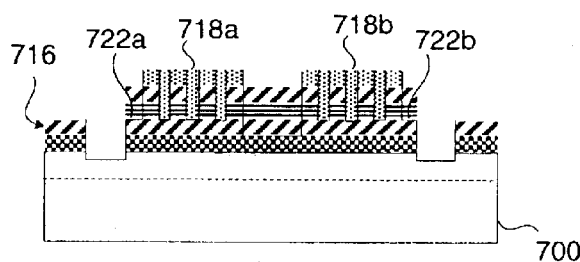
FIG. 77 is a cross-sectional view of the substrate illustrated in FIG. 76 taken along the line 77—77 in FIG. 76.
Figure 76:
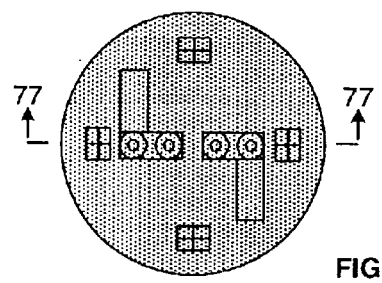
FIG. 76 is a top view of the substrate illustrated in FIG. 74 after portions of the additional protective layer has been removed, sense lines have been formed, and the resist material has been removed.

Once the patterned resist portions 720a, 720b have been deposited and patterned in step 634, the portions of the additional protective layer 718 not covered by the resist 720a, 720b is removed in step 636 of FIG. 51C, as shown in FIGS. 76 and 77. This may be accomplished, for example, by way of an RIE process, or other suitable process. Once the portions of the additional protective layer 718 not covered by the resist 720a, 720b have been removed, the resist 720a, 720b itself is removed. Removing the resist 720a, 720b, leaves portions of the additional protective layer 718a, 718b over and between the memory elements 714a–714d. Additionally, according to an embodiment of the invention, the thin protective coating 716 deposited in step 630 remains generally intact, to protect the elements not covered by the portions of the additional protective layer 718a, 718b, from oxidation or other undesirable effects.

In step 638 of FIG. 51C, an additional conductive layer 710a that might form an electrical connection in the center of the device (i.e., between the two pairs of memory elements) is removed. For example, according to an embodiment of the invention, the conductive layer 710a comprises a layer of copper, and any of that copper needing to be removed can be removed by way of an ion milling process. Once any additional portion of the conductive layer 710a between the pairs of memory elements 714a, 714b and 714c, 714d, the portions remaining of the conductive layer 710a form the bottom sense lines 722a, 722b, which are formed at a first side (i.e., beneath) of the memory devices (formed from the magnetic material 710b), as shown in FIGS. 76 and 77. However, in cases where no portion of the conductive layer 710a remained after step 636, step 638 may not be required, as the sense lines 722a, 722b would be fully formed after step 636. Thus, step 638 is optional, depending upon whether or not it is needed, and depending upon the specific design parameters and characteristics of the magnetoresistive memory devices being created by way of the techniques of the present invention.

Figure 79:
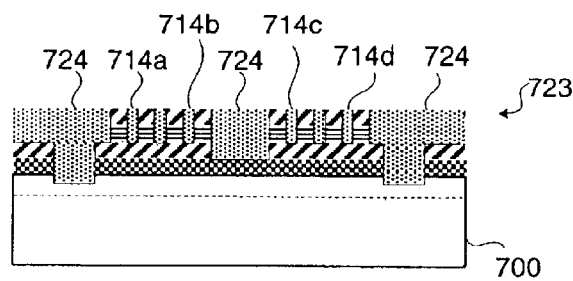
FIG. 79 is a cross-sectional view of the substrate illustrated in FIG. 78 taken along the line 79—79 in FIG. 78.
Figure 78:
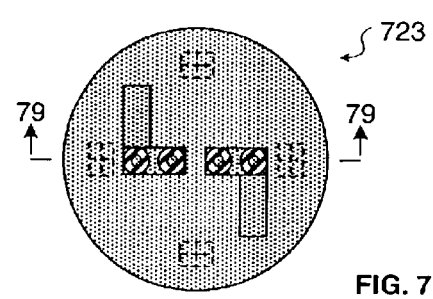
FIG. 78 is a top view of the substrate illustrated in FIG. 76 after the subassembly has been polished.

Once the sense lines 722a, 722b (the first conductors) have been formed (either by way of step 636 or 638), a third protective layer 724 is deposited over the entire subassembly 723 in step 640, and the entire subassembly is polished to expose a conductive portion of the cap layer 710 (i.e., portions of the conductive layer 710c) in step 642 of FIG. 51C. In accordance with an embodiment of the invention, the third protective layer 724 comprises a suitable insulator or dielectric material, and may be used for its protective and insulative properties. For example, in accordance with a specific embodiment of the invention, the third protective layer 724 is formed from silicon nitride (SiN). The subassembly 723 may be polished in step 642 by way of any of a variety of suitable polishing techniques. According to a specific embodiment of the invention, the third protective layer 724, is polished by way of a chemical mechanical polishing (CMP) technique in step 642, thereby exposing the top-most conductive layer 710c of the cap layer 710, which has been patterned to the form of the memory elements 714a–714d, as shown in FIGS. 78 and 79. Although the subassembly 723 shown in FIGS. 78 and 79 was formed by specific steps of the technique of FIGS. 51A–51F, it could, according to alternative embodiments of the invention, be formed using a variety of suitable techniques for forming a subassembly that can be used in a donor substrate process.

Figure 81:
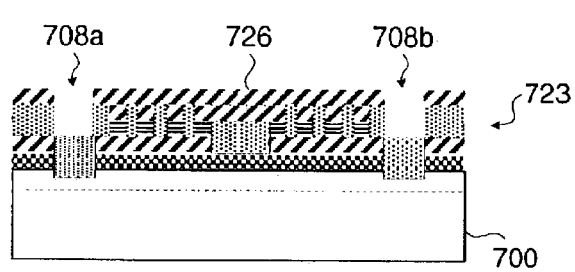
FIG. 81 is a cross-sectional view of the substrate illustrated in FIG. 80 taken along the line 81—81 in FIG. 80.
Figure 80:
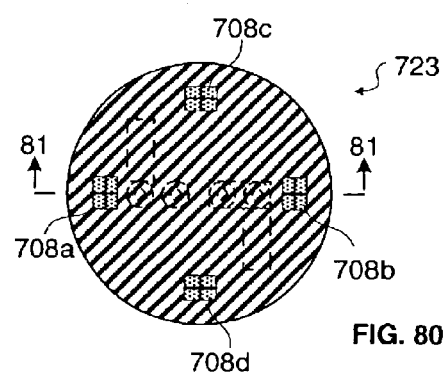
FIG. 80 is a top view of the substrate illustrated in FIG. 78 after a conductive layer has been deposited thereon and alignment windows have been opened.

In step 644 of FIG. 51C, a conductive layer 726 is deposited over the entire subassembly 723. This conductive layer 726 may be any number of a variety of conductors suitable to form sense lines of magnetoresistive memory devices. According to an embodiment of the invention, the conductive layer 726 is a copper layer. Once the conductive layer 726 has been deposited, an insulating layer (not shown) is deposited in step 645 of FIG. 51C. According to embodiments wherein alignment marks are used for aligning the substrate 700, alignment windows 708a, 708b, 708c, 708d may be optionally created in optional step 646, as shown in FIGS. 80 and 81.

Figure 83:
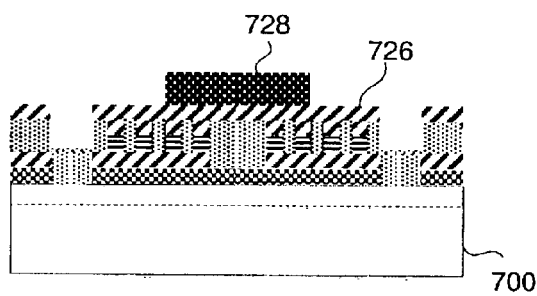
FIG. 83 is a cross-sectional view of the substrate illustrated in FIG. 82 taken along the line 83—83 in FIG. 82.
Figure 82:
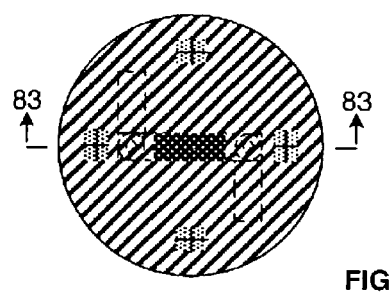
FIG. 82 is a top view of the substrate illustrated in FIG. 80 after resist material has been deposited thereon and patterned.
Figure 85:
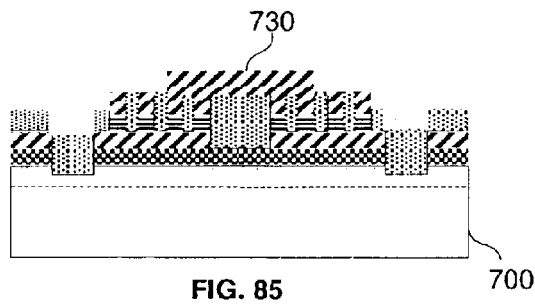
FIG. 85 is a cross-sectional view of the substrate illustrated in FIG. 84 taken along the line 85—85 in FIG. 84.
Figure 84:
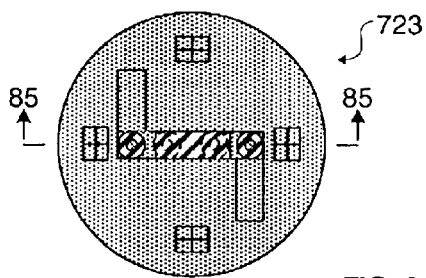
FIG. 84 is a top view of the substrate illustrated in FIG. 82 after conductive layer has been etched and the resist material has been removed.

After the conductive layer 726 has been deposited in step 644 of FIG. 51C, resist 728 is deposited and patterned to form sense lines, as shown in FIGS. 82 and 83. Once the resist has been deposited and patterned in step 648 of FIG. 51C, the technique continues in FIG. 51D, as the insulting layer (e.g., a hard metal layer) is etched and the resist is removed in steps 650 and 652, respectively, of FIG. 51D. The conductive layer 726 is then etched to define the top sense lines 730 in step 653 of FIG. 51D, as shown in FIGS. 84 and 85. Although only one sense line 730 is shown for the sake of simplicity, multiple sense lines can be formed in the same manner. The top sense lines 730 are a second conductor for each of the memory elements, and are formed at a second side of the memory elements, which is opposite the first side.

Figure 51D:
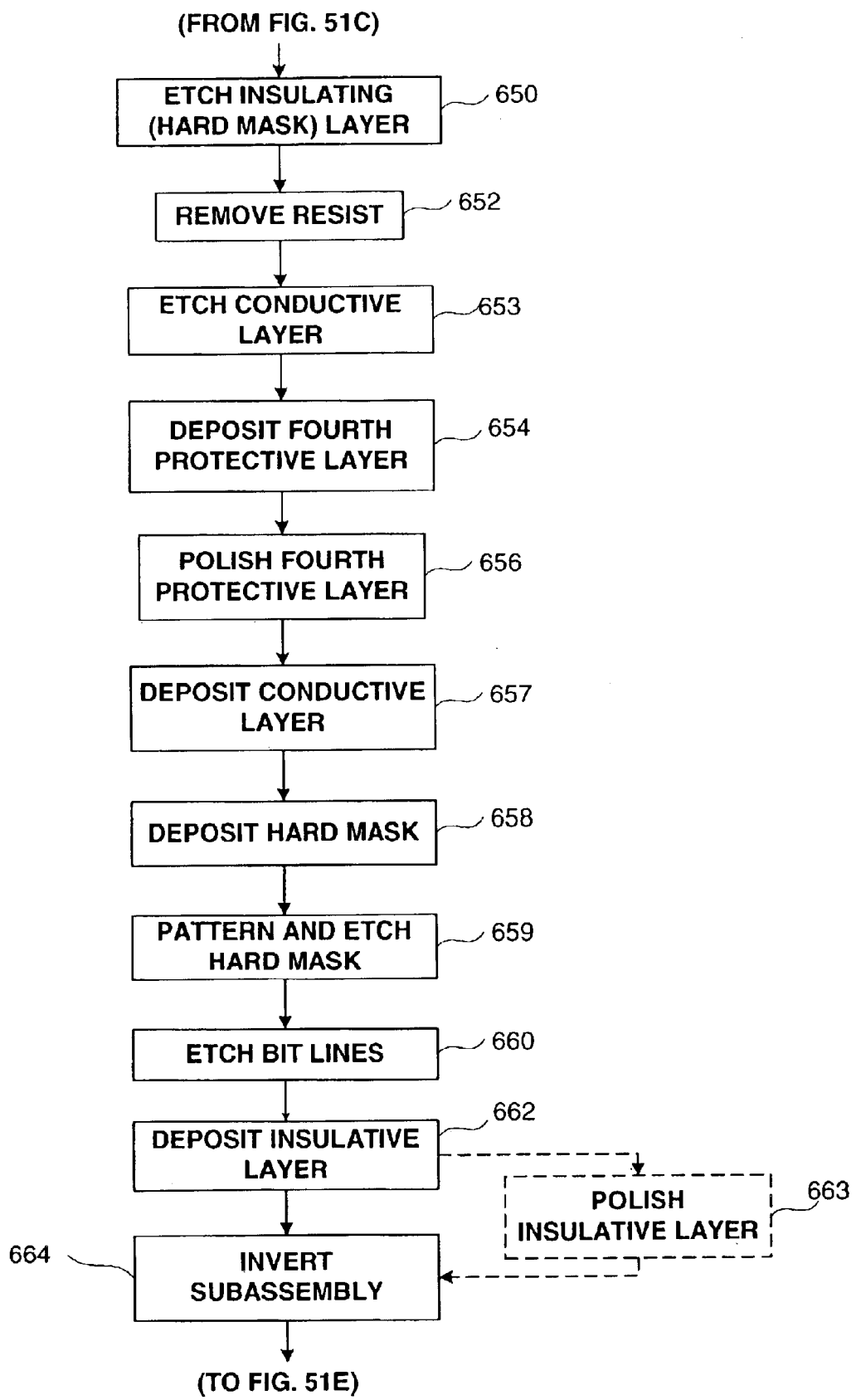
FIG. 51D is part of a flow chart illustrating one technique of fabricating a magnetoresistive memory device in accordance with one or more embodiments of the present invention.
Figure 87:
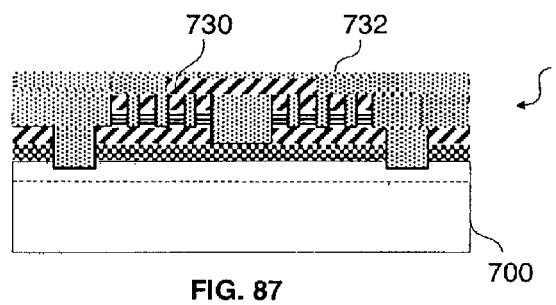
FIG. 87 is a cross-sectional view of the substrate illustrated in FIG. 86 taken along the line 87—87 in FIG. 86.
Figure 86:
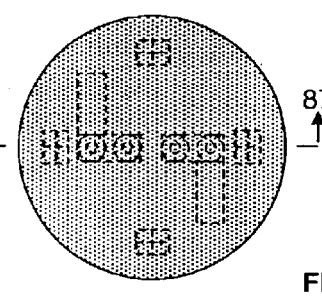
FIG. 86 is a top view of the substrate illustrated in FIG. 84 after a protective layer has been deposited thereon and the subassembly has been polished.

In steps 654 of FIG. 51D, a fourth protective layer 732 is deposited over the entire subassembly 723, as shown in FIGS. 86 and 87. Subsequently, the fourth protective layer 732 is polished in step 656 of FIG. 51D. According to embodiments of the invention, the fourth protective layer 732 may comprise a variety of materials suitable for protecting and insulating the subassembly 723. For example, in accordance with a specific embodiment of the invention, the fourth protective layer 732 may comprise a silicon nitride (SiN) layer. The fourth protective layer 732 is polished in a manner so as to leave a relatively thin protective layer over the bottom sense lines 730. According to an embodiment of the present invention, for example, the thickness of the portion of the fourth protective layer 732 over the bottom sense line 730 may be between about 50–500 nm. Preferably, the thickness of the portion of the fourth protective layer 732 over the bottom sense line 730 is approximately 50–300 nm, and more preferably between about 100–200 nm.

Figure 89:
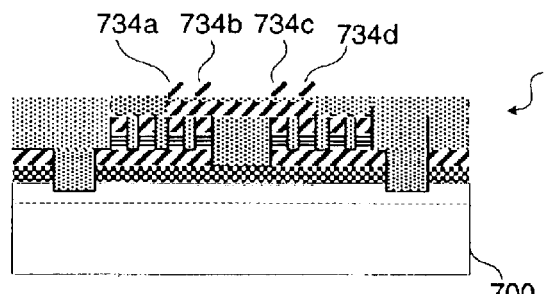
FIG. 89 is a cross-sectional view of the substrate illustrated in FIG. 88 taken along the line 89—89 in FIG. 88.
Figure 88:
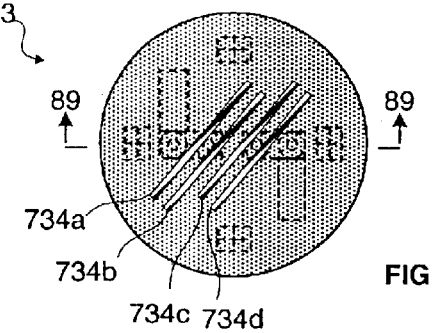
FIG. 88 is a top view of the substrate illustrated in FIG. 86 after a conductive layer has been deposited thereon and patterns, and bit lines have been etched.
Figure 91:
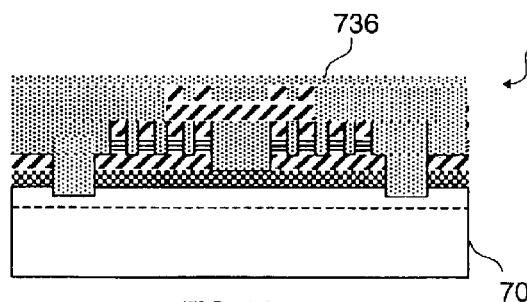
FIG. 91 is a cross-sectional view of the substrate illustrated in FIG. 90 taken along the line 91—91 in FIG. 90.
Figure 90:
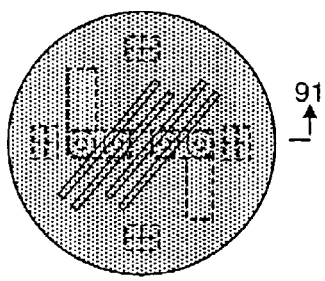
FIG. 90 is a top view of the subassembly illustrated in FIG. 88 after an insulative layer has been deposited thereon.

In step 657 of FIG. 51D, a conductive layer (i.e., a third conductor) is deposited over the subassembly 723. A hard mask is deposited in step 658 and is patterned and etched in step 659 of FIG. 51D. The bit lines (or word lines) 734a, 734b, 734c, 734d are then etched in step 660 of FIG. 51D, as shown in FIGS. 88 and 89. Once the bit lines 734a–734d have been etched in step 660, an insulative layer 736 is deposited over the entire subassembly 723 in step 662, including the bit lines, as shown in FIGS. 90 and 91. This insulative layer 736 may be selected from a variety of materials suitable for insulating the bit lines 734a–734d. For example, according to an embodiment of the invention, the insulative layer may comprise a silicon nitride (SiN) layer. Other materials may be used in accordance with other embodiments of the invention.

After the insulative layer 736 has been deposited in step 662, it may optionally be polished, as indicated by optional step 663 in FIG. 51D. This polishing may be carried out in a variety of fashions suitable for producing the desired polishing effect on the insulative layer 736. According to a specific embodiment of the invention, the insulative layer 736 may be polished by way of chemical mechanical polishing (CMP) to provide the desired thickness of insulative material 736 covering the bit lines 734a–734d.

Figure 51E:
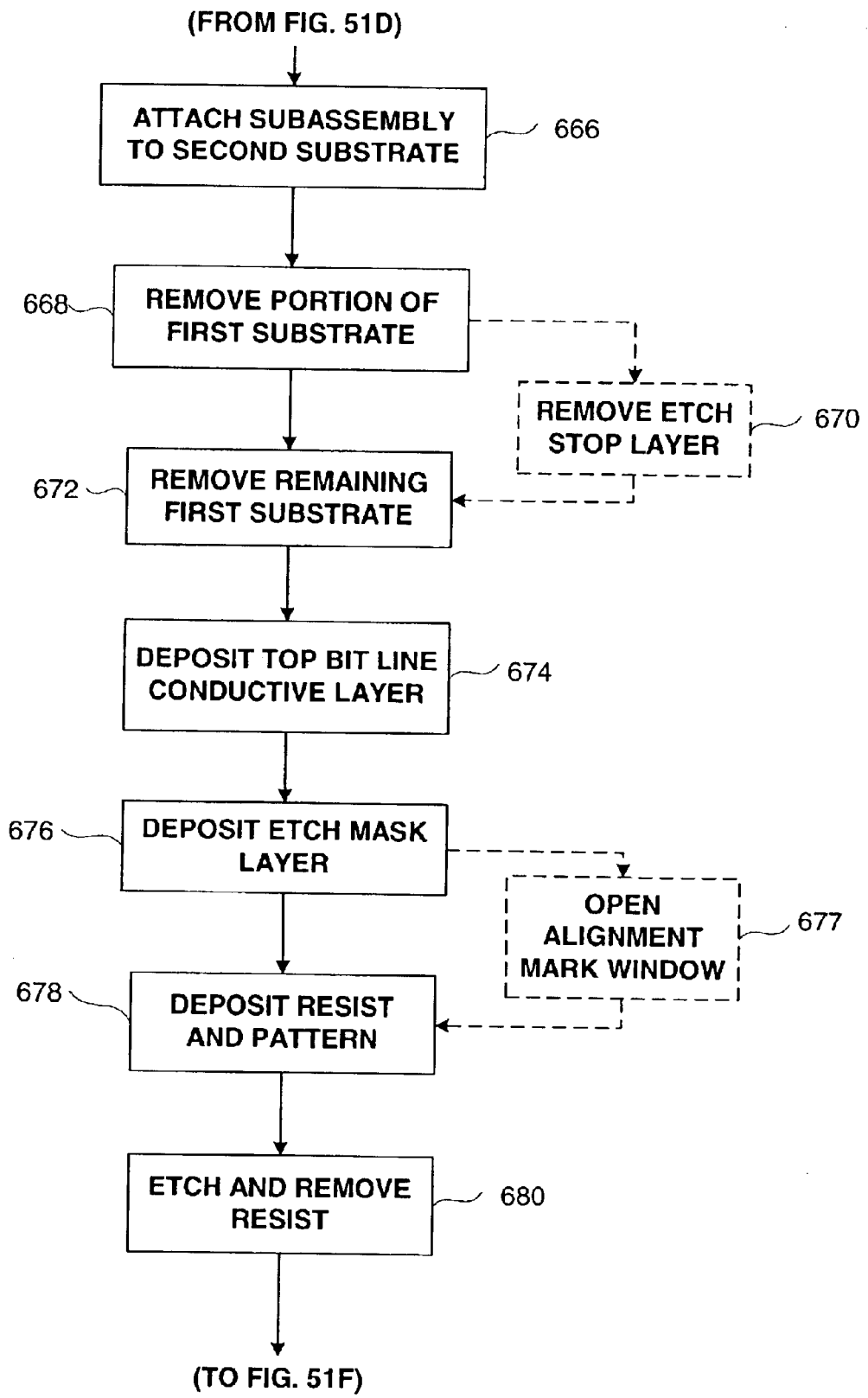
FIG. 51E is part of a flow chart illustrating one technique of fabricating a magnetoresistive memory device in accordance with one or more embodiments of the present invention.

In step 664 of FIG. 51D, the entire subassembly 723 is inverted and in step 666 of FIG. 51E the inverted subassembly 723 is attached to a second substrate 738, as shown in FIGS. 92 and 93. According to an embodiment of the invention, the base substrate 700 is a donor wafer, and the second substrate 738 is a handle wafer, and the two are attached or bonded in a donor substrate process. The subassembly 723 may be bonded to the second substrate 738 by way of a variety of suitable bonding techniques. For example, the subassembly 723 may be bonded to the handle wafer 738 by way of plasma techniques, glass-frit techniques, anodic techniques, or thermocompression techniques.

Once the subassembly 723 is attached to the second substrate 738, the portion of the first substrate 700 above the cleave interface 702, shown in FIG. 93, is removed in step 668 of FIG. 51E. This may occur, as the uppermost portion of the first substrate 700 is simply separated along the cleave interface 702 and removed. Alternatively, embodiments where the cleave interface 702 comprises an etch stop layer, the first substrate 700 may be ground and then etched until the etch stop layer 702 is reached, thereby removing the uppermost portion of the first substrate. Additionally, the substrate 700 can be cut along the cleave interface 702 according to a variety of cutting techniques. This cleave interface 702 is provided for handling convenience, and is used to prevent grinding or etching from reaching the memory devices of the subassembly 723, or any elements deposited on the donor substrate 700.

According to embodiments of the invention where the cleave interface 702 comprises an etch stop layer, the etch stop layer may be made of silicone dioxide ($SiO_2$), and the portion of the substrate 700 above the etch stop layer can be removed using a technique that etches only silicon. According to this embodiment of the invention, the etch stop layer may be removed in step 670 by way of a buffered oxide etch (BOE) or other suitable technique. Once the portion of the first substrate 700 above the cleave interface 702 is removed, in step 668 of FIG. 51E, the remaining portion of the first substrate 700 is removed. In accordance with an embodiment of the invention, the first substrate 700 comprises a silicon (Si) wafer. The remaining portion of the first substrate 700 may be removed by way of a variety of suitable techniques, including but not limited to, reactive ion etching (RIE). For example, xenondifluoride ($XeF_2$) crystals may be used to produce fluorine vapors that etch silicon with high selectivity, leaving other portions of the subassembly unaffected. Alternatively, the substrate 700 can be ground down until the cleave interface 702 is reached and the remaining portion of the substrate is removed using a suitable technique (e.g., using gas to selectively remove the remaining silicon).

Once the remaining portion of the first substrate 700 is removed, the first insulative layer 704 is exposed. Over this first insulative layer 704, a top bit line conductive layer 740 (the fourth conductor), is deposited in step 674 of FIG. 51E at the first side of the memory elements, followed by an etch mask layer 742 in step 676, as shown in FIGS. 94 and 95. Thus, the fourth conductor is deposited at the first side of the memory elements after the first conductor. According to embodiments of the invention making use of alignment marks, alignment windows may optionally be opened, as shown in optional step 677 of FIG. 51E.

As shown in FIGS. 94 and 95, resist 744 is deposited and patterned in the form of bit lines in step 678 of FIG. 51E. As can be seen in FIG. 94, the bit lines to be formed on top of the device are substantially orthogonal to the bit lines on the bottom of the device, which can be seen by the illustrated broken lines. Once the resist 744 is deposited and patterned in step 678, the etch mask layer is etched, and the resist is removed, leaving an etched mask layer having etch mask portions 742a, 742b, 742c, 742d formed in the shape of bit lines. The etched mask layer may be etched by way of reactive ion etching (RIE), or some other suitable technique. According to an embodiment of the invention, the etch mask layer may comprise silicon nitride (SiN), or some other suitable material. The resist is removed in step 680 of FIG. 51E, leaving the portions 742a–742d of the etch mask layer as shown in FIGS. 96 and 97.

Figure 51F:
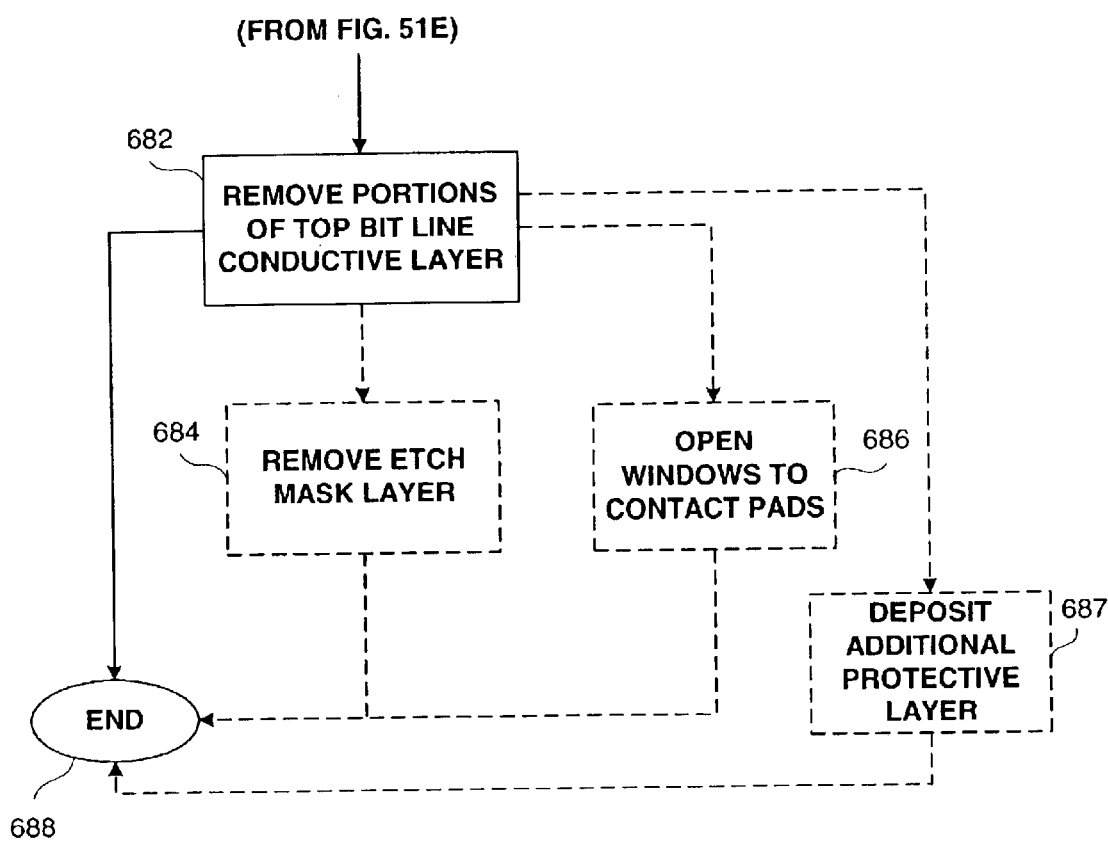
FIG. 51F is part of a flow chart illustrating one technique of fabricating a magnetoresistive memory device in accordance with one or more embodiments of the present invention.
Figure 101:
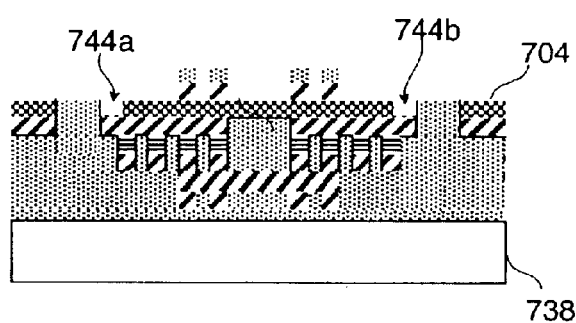
FIG. 101 is a cross-sectional view of the inverted subassembly illustrated in FIG. 100 taken along the line 101—101 in FIG. 100.
Figure 100:
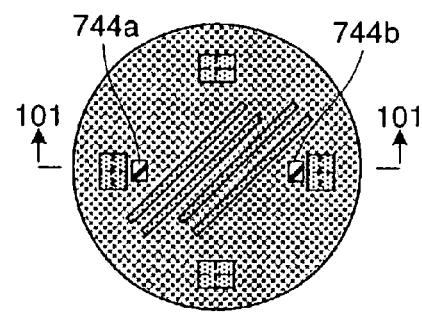
FIG. 100 is a top view of the inverted subassembly illustrated in FIG. 98 after windows have been opened through the insulator to contact pads.

The technique is continued in FIG. 51F, as portions of the top bit line conductive layer 740, not having portions of the etch mask layer 742a–742d deposited thereon, are removed in step 682 resulting in the configurations shown in FIGS. 98 and 99. The portions of the top bit line conductive layer 740 not protected by the etch mask layer portions 742a–742d may be removed, for example, by way of ion milling, or some other suitable removal technique. Once the bit lines 740a, 740b, 740c, 740d have been formed from the top bit line conductive layer 740, as shown in FIGS. 98 and 99 at the first side of the memory elements, one or more of optional steps 684, 686, and 687 of FIG. 51F may be executed. For example, as shown in optional step 684, the portions of the etch mask layer remaining 742a–742d may be removed. It will be recognized that the conductors forming the bit lines, formed in accordance with the steps described in FIGS. 51A–51E, show no or little indications or artifacts of a polishing process (e.g., CMP or the like) in accordance with some embodiments of the invention. Additionally, as shown in FIGS. 100 and 101, windows in the first insulative layer 704 may be opened to provide contact pads 744a, 744b to the first sense lines 722a, 722b in optional step 686 of FIG. 51F. Also, an additional protective or insulated layer could be deposited over the device in option step 687. After the steps in FIGS. 51A–51F have been executed, including any optional steps or substitutes that are to be executed, the method ends in step 688 shown in FIG. 51F.

The various fabrication methods and processes described for fabricating magnetoresistive memory devices can be used to produce multiple memory devices on a single substrate. These multiple memory devices can be connected by way of conventional schemes to provide large amounts of non-volatile magnetic memory. The layout of such combinations of magnetoresistive memory devices may vary, and devices fabricated according to the various techniques of the present invention are suitable to be employed within many of these variations. Moreover, additional features and elements that could be used in connection with magnetoresistive memory devices, or a group of such devices, may be bonded onto the device or group of devices. For example, when a group of magnetoresistive memory devices are used together on a single substrate, a power circuit, a driving circuit, or a control circuit could be bonded to the group of devices, and formed integrally with the group of devices in a unitary construction. Alternatively, circuits such as power circuits and the like, could be formed separately from the magnetoresistive memory devices, and connected thereto via a bonding or other suitable process.

The principles, preferred embodiments, and modes of operation of the present invention have been described in the foregoing description. However, the invention that is intended to be protected is not to be construed as limited to the particular embodiments disclosed. Further, the embodiments described herein are to be regarded as illustrative rather than restrictive. Others may make variations and changes, and employ equivalents without departing from the spirit of the present invention. Accordingly, it is expressly intended that all such variations, changes and equivalents that fall within the spirit and scope of the present invention as defined in the claims be embraced thereby.

What is claimed is:

1. A method of fabricating a magnetoresistive memory device, the magnetoresistive memory device having a magnetic memory element and a plurality of conductors for at least one of reading and writing the magnetic memory element, the plurality of conductors including a first conductor at least partially located at a first side of the magnetic memory element for reading the magnetic memory element, a second conductor at least partially located at a second side of the magnetic memory element for reading the magnetic memory element, a third conductor at least partially located at the second side of the magnetic memory element for writing the magnetic memory element, and a fourth conductor at least partially located at the first side of the magnetic memory element for writing the magnetic memory element, the method comprising:
   forming the first conductor before forming the fourth conductor.

2. The method of claim 1, further comprising:
   forming the magnetic memory element after said forming the first conductor.

3. The method of claim 2, said forming the magnetic memory element including forming a plurality of annular magnetic layers.

4. The method of claim 2, said forming the magnetic memory element magnetic memory element including forming a magnetic layer.

5. The method of claim 4, the magnetic layer being a first magnetic layer, said forming the magnetic memory element including forming a second magnetic layer that is parallel with the first magnetic layer.

6. The method of claim 5, said forming the magnetic memory element including forming a conductive layer that separates the first magnetic layer and the second magnetic layer.

7. The method of claim 5, said forming the magnetic memory element including forming an electrically insulative layer that separates the first magnetic layer and the second magnetic layer.

8. The method of claim 2, said forming the magnetic memory element including forming a magnetic layer having a linear magnetization configuration.

9. The method of claim 2, said forming the magnetic memory element including forming a magnetic layer having a circular magnetization configuration.

10. The method of claim 2, said forming the magnetic memory element including forming a plurality of magnetic layers.

11. The method of claim 10, said forming a plurality of magnetic layers including forming at least one of the layers with a higher coercive field than another of the plurality of magnetic layers.

12. The method of claim 1, said method of fabricating a magnetoresistive memory device including forming at least one of a spin valve device, a pseudo spin valve device, and a magnetic tunneling junction device.

13. The method of claim 1, further comprising:
   forming the third conductor and the fourth conductor such that the third conductor and the fourth conductor each include a pair of word lines.

14. The method of claim 13, said forming the third conductor and the fourth conductor including forming the pair of word lines of the fourth conductor orthogonal to the pair of word lines of the third conductor.

15. A chip including a magnetoresistive memory device formed according to the method of claim 1.

16. A method of manufacturing a magnetoresistive memory device, the method comprising the following steps in the following order:
   (a) forming at least a first conductor for at least reading a magnetic memory element of the magnetoresistive memory device, the magnetic memory element for storing a bit state of the magnetoresistive memory device;
   (b) forming the magnetic memory element;
   (c) forming at least a second conductor for at least reading the magnetic memory element;
   (d) forming at least a third conductor for at least writing the magnetic memory element at one side of the magnetic memory element; and
   (e) forming at least a fourth conductor for at least writing the magnetic memory element at another side of the magnetic memory element that is opposite from the one side.

17. The method of claim 16, said forming the first conductor, said forming the magnetic memory element, said forming the second conductor, and said forming the third conductor being performed on a substrate to define a subassembly of the magnetoresistive memory device on the substrate.

18. The method of claim 17, further comprising:
   inverting the substrate and subassembly after said forming the first conductor, said forming the magnetic memory element, said forming the second conductor, and said forming the third conductor.

19. The method of claim 18, the substrate being a first substrate, further comprising:
   attaching the inverted subassembly to a second substrate.

20. The method of claim 19, further comprising:
   removing at least a portion of the first substrate from the subassembly.

21. The method of claim 20, said forming the forth conductor being performed after said removing of at least a portion of the first substrate from the subassembly.

22. The method of claim 16, said forming the magnetic memory element including forming a plurality of annular magnetic layers.

23. The method of claim 16, said forming the magnetic memory element magnetic memory element including forming a magnetic layer.

24. The method of claim 23, the magnetic layer being a first magnetic layer, said forming the magnetic memory element including forming a second magnetic layer that is parallel with the first magnetic layer.

25. The method of claim 24, said forming the magnetic memory element including forming a conductive layer that separates the first magnetic layer and the second magnetic layer.

26. The method of claim 24, said forming the magnetic memory element including forming an electrically insulative layer that separates the first magnetic layer and the second magnetic layer.

27. The method of claim 16, said forming the magnetic memory element including forming a magnetic layer having a linear magnetization configuration.

28. The method of claim 16, said forming the magnetic memory element including forming a magnetic layer having a circular magnetization configuration.

29. The method of claim 16, said method of fabricating a magnetoresistive memory device including forming at least one of a spin valve device, a pseudo spin valve device, and a magnetic tunneling junction device.

30. The method of claim 16, further comprising:
    forming the third conductor and the fourth conductor such that the third conductor and the fourth conductor each include a pair of word lines.

31. The method of claim 30, said forming the third conductor and the fourth conductor including forming the pair of word lines of the fourth conductor orthogonal to the pair of word lines of the third conductor.

32. The method of claim 16, said forming the first, second, third, and fourth conductors each comprising:
    depositing a conductive layer and then patterning the conductive layer.

33. The method of claim 16, the magnetoresistive memory device being a first magnetoresistive memory device on a substrate, said method further comprising:
    simultaneously manufacturing at least a second magnetoresistive memory device on the substrate while manufacturing the first magnetoresistive memory device.

34. The method of claim 16, the magnetoresistive memory device being a first magnetoresistive memory device on a substrate, said method further comprising:
    manufacturing at least a second magnetoresistive memory device on the substrate after manufacturing the first magnetoresistive memory device.

35. A chip including a magnetoresistive memory device formed according to the method of claim 16.

36. A method comprising:
    utilizing a donor substrate process during the forming of a magnetic memory element and a plurality of conductors of a magnetoresistive memory device, the plurality of conductors for reading and writing the magnetic memory element.

37. A chip including a magnetic memory element formed according to the method of claim 36.

* * * * *

UNITED STATES PATENT AND TRADEMARK OFFICE
CERTIFICATE OF CORRECTION

PATENT NO. : 6,927,073 B2  
APPLICATION NO. : 10/435669  
DATED : August 9, 2005  
INVENTOR(S) : Harold A. Huggins It is certified that error appears in the above-identified patent and that said Letters Patent is hereby corrected as shown below:

Column 11,  
Line 58, delete "fefth.".

Column 30,  
Line 65, replace "forth" with -- fourth --.

Signed and Sealed this

Twentieth Day of June, 2006

JON W. DUDAS  
*Director of the United States Patent and Trademark Office*